US012574010B2

(12) United States Patent
Wang et al.

(10) Patent No.: US 12,574,010 B2
(45) Date of Patent: Mar. 10, 2026

(54) HYBRID FILTER, PREPARATION METHOD THEREOF, AND FILTERING APPARATUS

(71) Applicants:Beijing BOE Optoelectronics Technology Co., Ltd., Beijing (CN); BOE Technology Group Co., Ltd., Beijing (CN)

(72) Inventors: Lihui Wang, Beijing (CN); Yue Li, Beijing (CN); Qiuxu Wei, Beijing (CN); Yanfei Ren, Beijing (CN); Yuelei Xiao, Beijing (CN); Yulin Feng, Beijing (CN); Xue Cao, Beijing (CN); Kidong Han, Beijing (CN); Wenbo Chang, Beijing (CN); Yifan Wu, Beijing (CN); Qichang An, Beijing (CN); Huiying Li, Beijing (CN); Yi Zhou, Beijing (CN); Feng Qu, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 124 days.

(21) Appl. No.: 18/290,818

(22) PCT Filed: Aug. 24, 2022

(86) PCT No.: PCT/CN2022/114511
§ 371 (c)(1),
(2) Date: Jan. 22, 2024

(87) PCT Pub. No.: WO2024/040468
PCT Pub. Date: Feb. 29, 2024

(65) Prior Publication Data
US 2025/0096775 A1 Mar. 20, 2025

(51) Int. Cl.
*H03H 9/54* (2006.01)
*H03H 3/02* (2006.01)
(Continued)

(52) U.S. Cl.
CPC .............. *H03H 9/542* (2013.01); *H03H 3/02* (2013.01); *H03H 9/133* (2013.01); *H03H 9/17* (2013.01)

(58) Field of Classification Search
CPC ........ H03H 9/542; H03H 9/173; H03H 9/605; H03H 3/02; H03H 9/64; H03H 7/0115; (Continued)

(56) References Cited

U.S. PATENT DOCUMENTS

2006/0066419 A1 3/2006 Iwaki et al.
2006/0244552 A1 11/2006 Park et al.
(Continued)

FOREIGN PATENT DOCUMENTS

CN 1756076 A 4/2006
CN 100474770 C 4/2009
(Continued)

OTHER PUBLICATIONS

International Search Report for PCT/CN2022/114511 Mailed Apr. 26, 2023.

*Primary Examiner* — Lincoln D Donovan
*Assistant Examiner* — Tyler J Pereny
(74) *Attorney, Agent, or Firm* — Ling Wu; Stephen Yang; Ling and Yang Intellectual Property

(57) ABSTRACT

The present disclosure provides a hybrid filter, a preparation method thereof, and a filtering apparatus. The hybrid filter includes a first substrate (100) and a second substrate (200) disposed oppositely, a first space (300) is disposed between the first substrate (100) and the second substrate (200), at least one of the first substrate (100) and the second substrate
(Continued)

(200) is provided with a film bulk acoustic resonator (30), at least one of the first substrate (100) and the second substrate (200) is provided with at least one passive filter (40), the film bulk acoustic resonator (30) is disposed in the first space (300) and is connected with the passive filter (40), the passive filter (40) includes a filtering inductor and a filtering capacitor, and the filtering inductor has a three-dimensional spiral inductor structure.

19 Claims, 6 Drawing Sheets

(51) Int. Cl.

| | | |
|---|---|---|
| *H03H 9/13* | (2006.01) | |
| *H03H 9/17* | (2006.01) | |

(58) Field of Classification Search

CPC ...... H03H 9/0547; H03H 9/105; H03H 9/568; H03H 9/6483; H03H 9/706; H03H 9/1007; H03H 9/132; H03H 9/564; H03H 9/566; H03H 9/725; H03H 3/08; H03H 7/0138; H03H 7/1758; H03H 7/463; H03H 9/0523; H03H 9/02102; H03H 9/02007; H03H 9/02015; H03H 9/205; H01L 23/49822; H01L 23/66; H01L 23/5223; H01L 23/5227; H01L 23/5384; H01L 23/642; H01L 23/645; H01F 17/00; H01F 17/0013; H01F 17/0033; H01F 2017/002; H01F 2027/2809; H01F 27/28; H01F 27/2804; H01F 27/2823; H01F 27/29; H01F 27/292

See application file for complete search history.

(56) References Cited

U.S. PATENT DOCUMENTS

| | | | |
|---|---|---|---|
| 2017/0338034 A1 | 11/2017 | Yun et al. | |
| 2018/0337136 A1* | 11/2018 | Han | H01L 23/5384 |
| 2020/0228094 A1 | 7/2020 | Kato | |
| 2020/0235716 A1 | 7/2020 | Eid et al. | |
| 2021/0099149 A1 | 4/2021 | Lan et al. | |
| 2023/0147060 A1* | 5/2023 | Takano | H03H 3/08 |
| | | | 310/313 R |

FOREIGN PATENT DOCUMENTS

| | | | |
|---|---|---|---|
| CN | 109155299 | A | 1/2019 |
| CN | 110492864 | A | 11/2019 |
| CN | 209787129 | U | 12/2019 |
| CN | 111164889 | A | 5/2020 |
| CN | 111446943 | A | 7/2020 |
| CN | 111585540 | A | 8/2020 |
| CN | 111968995 | A | 11/2020 |
| CN | 113904644 | A | 1/2022 |

* cited by examiner

HYBRID FILTER, PREPARATION METHOD THEREOF, AND FILTERING APPARATUS

CROSS-REFERENCE TO RELATED APPLICATION

The present application is a U.S. National Phase Entry of International Application No. PCT/CN2022/114511 having an international filing date of Aug. 24, 2022, contents of the above-identified application should be interpreted as being incorporated into the present application by reference.

TECHNICAL FIELD

The present disclosure relates to, but is not limited to, the field of semiconductor technologies, in particular to a hybrid filter, a preparation method thereof, and a filtering apparatus.

BACKGROUND

As an important component of a communication terminal, a filter may solve a problem of mutual interference in a process of signal transmission and improve a spectrum utilization rate. With development of mobile communication technologies, mobile communication systems require a faster transmission rate, a higher spectrum utilization rate, a more equipment access amount, and lower time delay, so higher requirements are put forward for filters, such as a wide bandwidth, a high roll-off coefficient, and a low parasitic effect.

SUMMARY

The following is a summary of subject matter described herein in detail. The summary is not intended to limit the scope of protection of claims.

In one aspect, the present disclosure provides a hybrid filter including a first substrate and a second substrate disposed oppositely, wherein a first space is disposed between the first substrate and the second substrate, at least one of the first substrate and the second substrate is provided with a film bulk acoustic resonator, at least one of the first substrate and the second substrate is provided with at least one passive filter, the film bulk acoustic resonator is disposed in the first space and connected with the passive filter, the passive filter includes a filtering inductor and a filtering capacitor, and the filtering inductor has a three-dimensional spiral inductor structure.

In an exemplary implementation mode, the first substrate at least includes a first base substrate and a first connection block disposed on a side of the first base substrate close to the second substrate, the second substrate at least includes a second base substrate and a second connection block disposed on a side of the second base substrate close to the first substrate, the first connection block and the second connection block are connected by means of bonding, the first space accommodating the film bulk acoustic resonator is formed between the first base substrate and the second base substrate, and materials of the first base substrate and the second base substrate include glass.

In an exemplary implementation mode, the first connection block and the second connection block connected by means of bonding form a ring-shaped sealing structure on a plane parallel to the hybrid filter, and the first space is a gas-sealed and/or acoustic-sealed sealed space enclosed by the first base substrate, the second base substrate, and the ring-shaped sealing structure.

In an exemplary implementation mode, the film bulk acoustic resonator at least includes a cavity, a first electrode disposed on the first base substrate, a piezoelectric layer disposed on a side of the first electrode away from the first base substrate, and a second electrode disposed on a side of the piezoelectric layer away from the first base substrate; the cavity is a groove disposed on a side of the first base substrate close to the second substrate, or the cavity is a through slot disposed on the first base substrate, or the cavity is a space enclosed by a surface of the first base substrate on a side close to the second substrate, the first electrode, and the piezoelectric layer.

In an exemplary implementation mode, n conductive pillars penetrating through the first base substrate in a thickness direction are disposed on the first base substrate of the first substrate, (n−1)/2 first connection lines are disposed on a side of the first base substrate away from the second substrate, (n−1)/2 second connection lines are disposed on a side of the first base substrate close to the second substrate, the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, a first conductive pillar among the n conductive pillars is connected with a second electrode of the film bulk acoustic resonator, an n-th conductive pillar among the n conductive pillars is connected with the filtering capacitor, the n conductive pillars, the (n−1)/2 first connection lines, and the (n−1)/2 second connection lines constitute the filtering inductor with the three-dimensional spiral inductor structure, wherein n is an odd number greater than 1 and i is a positive integer greater than or equal to 1 and less than or equal to n−2.

In an exemplary implementation mode, the filtering capacitor includes a first electrode plate, a second electrode plate, and a dielectric layer disposed between the first electrode plate and the second electrode plate, wherein the first electrode plate is disposed on a side of the first base substrate away from the second substrate and connected with the n-th conductive pillar among the n conductive pillars, the dielectric layer is disposed on a side of the first electrode plate away from the first base substrate, the second electrode plate is disposed on a side of the dielectric layer away from the first base substrate, and an orthographic projection of the first electrode plate on the first base substrate is at least partially overlapped with an orthographic projection of the second electrode plate on the first base substrate.

In an exemplary implementation mode, the hybrid filter further includes a first terminal and a second terminal, the first terminal is disposed on a side of the first base substrate away from the second substrate and connected with a first electrode of the film bulk acoustic resonator, and the second terminal is disposed on a side of the dielectric layer away from the first base substrate and connected with the second electrode plate.

In an exemplary implementation mode, an electrode conductive pillar penetrating through the first base substrate in a thickness direction is disposed on the first base substrate, and the first electrode of the film bulk acoustic resonator is connected with the first terminal through the electrode conductive pillar.

In an exemplary implementation mode, a first passive filter is disposed on the second substrate, or a first passive filter and a second passive filter are disposed on the second substrate, the first passive filter and the second passive filter are disposed on both sides of the film bulk acoustic reso-nator, the first passive filter includes a first filtering inductor and a first filtering capacitor connected with each other, and the second passive filter includes a second filtering inductor and a second filtering capacitor connected with each other.

In an exemplary implementation mode, n conductive pillars penetrating through the second base substrate in a thickness direction are disposed on the second base substrate of the second substrate, (n−1)/2 first connection lines are disposed on a side of the second base substrate away from the first substrate, (n−1)/2 second connection lines are disposed on a side of the second base substrate close to the first substrate, the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, a first conductive pillar among the n conductive pillars is connected with a second electrode of the film bulk acoustic resonator, an n-th conductive pillar among the n conductive pillars is connected with the first filtering capacitor, the n conductive pillars, the (n−1)/2 first connection lines, and the (n−1)/2 second connection lines constitute the first filtering inductor with a three-dimensional spiral inductor structure, wherein n is an odd number greater than 1 and i is a positive integer greater than or equal to 1 and less than or equal to n−2.

In an exemplary implementation mode, the first filtering capacitor includes a first electrode plate, a second electrode plate, and a dielectric layer disposed between the first electrode plate and the second electrode plate, wherein the first electrode plate is disposed on a side of the second base substrate away from the first substrate and connected with the n-th conductive pillar, the dielectric layer is disposed on a side of the first electrode plate away from the second base substrate, the second electrode plate is disposed on a side of the dielectric layer away from the second base substrate, and an orthographic projection of the first electrode plate on the second base substrate is at least partially overlapped with an orthographic projection of the second electrode plate on the second base substrate.

In an exemplary implementation mode, the hybrid filter further includes a first terminal and a second terminal, the first terminal is disposed on a side of the second base substrate away from the first substrate and connected with a first electrode of the film bulk acoustic resonator, and the second terminal is disposed on a side of the dielectric layer away from the second base substrate and connected with the second electrode plate.

In an exemplary implementation mode, the first substrate further includes a third connection block, the second sub-strate further includes a fourth connection block and an electrode conductive pillar, wherein the third connection block is disposed on a side of the first electrode of the film bulk acoustic resonator close to the second substrate, the fourth connection block is disposed on a side of the second base substrate close to the first substrate, an end of the electrode conductive pillar away from the first substrate is connected with the first terminal, an end of the electrode conductive pillar close to the first substrate is connected with the fourth connection block, the third connection block is connected with the fourth connection block by means of bonding, to enable the first electrode of the film bulk acoustic resonator to be connected with the first terminal through the third connection block, the fourth connection block, and the electrode conductive pillar.

In an exemplary implementation mode, the first substrate further includes a fifth connection block, and the second substrate further includes a sixth connection block, wherein the fifth connection block is disposed on a side of a second electrode of the film bulk acoustic resonator close to the second substrate, the sixth connection block is disposed on a side of the second base substrate close to the first substrate and connected with the first conductive pillar among the n conductive pillars, the fifth connection block and the sixth connection block are connected by means of bonding, to enable the second electrode of the film bulk acoustic reso-nator to be connected with the first filtering inductor through the fifth connection block and the sixth connection block.

In an exemplary implementation mode, n+m conductive pillars penetrating through the second base substrate in a thickness direction are disposed on the second base substrate of the second substrate, (n−1)/2 first connection lines and (m−1)/2 third connection lines are disposed on a side of the second base substrate away from the first substrate, (n−1)/2 second connection lines and (m−1)/2 fourth connection lines are disposed on a side of the second base substrate close to the first substrate, n conductive pillars, the (n−1)/2 first connection lines, and (n−1)/2 in second connection lines are disposed on one side of the film bulk acoustic resonator, and m conductive pillars, the (m−1)/2 third connection lines, and the (m−1)/2 fourth connection lines are disposed on the other side of the film bulk acoustic resonator; the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, the third connection lines are respectively connected with a j-th conductive pillar and a (j+1)-th conductive pillar among the m conductive pillars, the fourth connection lines are respectively connected with the (j+1)-th conductive pillar and a (j+2)-th conductive pillar among the m conduc-tive pillars, a first conductive pillar among the n conductive pillars is connected with a second electrode of the film bulk acoustic resonator, an n-th conductive pillar among the n conductive pillars is connected with the first filtering capaci-tor, a first conductive pillar among the m conductive pillars is connected with a first electrode of the film bulk acoustic resonator, and an m-th conductive pillar among the m conductive pillars is connected with the second filtering capacitor; the n conductive pillars, the (n−1)/2 first connec-tion lines, and the (n−1)/2 second connection lines constitute the first filtering inductor with a three-dimensional spiral inductor structure, the m conductive pillars, the (m−1)/2 third connection lines, and the (m−1)/2 fourth connection lines constitute the second filtering inductor with a three-dimensional spiral inductor structure, wherein n is an odd number greater than 1, m is an odd number greater than 1, i is a positive integer greater than or equal to 1 and less than or equal to n−2, and j is a positive integer greater than or equal to 1 and less than or equal to m−2.

In an exemplary implementation mode, the first filtering capacitor includes a first electrode plate, a second electrode plate, and a dielectric layer disposed between the first electrode plate and the second electrode plate, the second filtering capacitor includes a third electrode plate, a fourth electrode plate, and a dielectric layer disposed between the third electrode plate and the fourth electrode plate; the first electrode plate and the third electrode plate are disposed on a side of the second base substrate away from the first substrate, the first electrode plate is connected with the n-th conductive pillar among the n conductive pillars, and the third electrode plate is connected with the m-th conductive pillar among the m conductive pillars; the dielectric layer is disposed on a side of the first electrode plate and the third electrode plate away from the second base substrate, the second electrode plate and the fourth electrode plate are disposed on a side of the dielectric layer away from the second base substrate, an orthographic projection of the first electrode plate on the second base substrate is at least partially overlapped with an orthographic projection of the second electrode plate on the second base substrate, and an orthographic projection of the third electrode plate on the second base substrate is at least partially overlapped with an orthographic projection of the fourth electrode plate on the second base substrate.

In an exemplary implementation mode, the hybrid filter further includes a first terminal and a second terminal, wherein the first terminal and the second terminal are disposed on a side of the dielectric layer away from the second base substrate, the first terminal is connected with the fourth electrode plate, and the second terminal is connected with the second electrode plate.

In an exemplary implementation mode, the first substrate further includes a third connection block, the second substrate further includes a fourth connection block, the third connection block is disposed on a side of the first electrode of the film bulk acoustic resonator close to the second substrate, the fourth connection block is disposed on a side of the second base substrate close to the first substrate and is connected with the first conductive pillar among the m conductive pillars, the third connection block and the fourth connection block are connected by means of bonding, to enable the first electrode of the film bulk acoustic resonator to be connected with the second filtering inductor through the third connection block and the fourth connection block.

In an exemplary implementation mode, the first substrate further includes a fifth connection block, and the second substrate further includes a sixth connection block, wherein the fifth connection block is disposed on a side of the second electrode of the film bulk acoustic resonator close to the second substrate, the sixth connection block is disposed on a side of the second base substrate close to the first substrate and connected with the first conductive pillar among the n conductive pillars, the fifth connection block and the sixth connection block are connected by means of bonding, to enable the second electrode of the film bulk acoustic resonator to be connected with the first filtering inductor through the fifth connection block and the sixth connection block.

In another aspect, the present disclosure also provides a filtering apparatus including the aforementioned hybrid filter.

In yet another aspect, the present disclosure also provides a preparation method of a hybrid filter, including: preparing a first substrate and a second substrate, respectively, wherein at least one of the first substrate and the second substrate is provided with a film bulk acoustic resonator, at least one of the first substrate and the second substrate is provided with at least one passive filter, the passive filter includes a filtering inductor and a filtering capacitor, and the filtering inductor has a three-dimensional spiral inductor structure; and forming a first space between the first substrate and the second substrate which are disposed oppositely, wherein the film bulk acoustic resonator is disposed in the first space and connected with the passive filter.

After drawings and detailed description are read and understood, other aspects may be comprehended.

BRIEF DESCRIPTION OF DRAWINGS

The accompany drawings are used for providing further understanding of technical solutions of the present disclosure, constitute a part of the specification, and together with the embodiments of the present disclosure, are used for explaining the technical solutions of the present disclosure, and do not constitute limitations on the technical solutions of the present disclosure.

Figure 1:
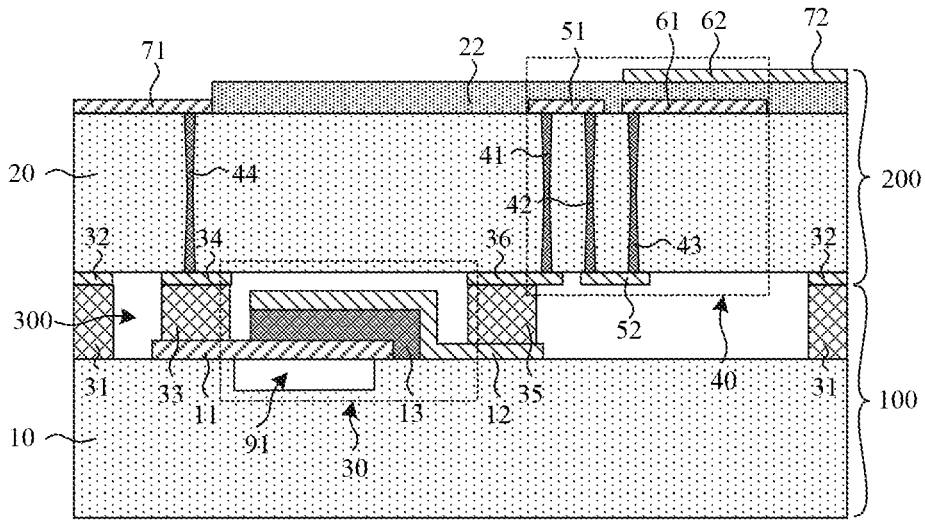
FIG. 1 is a schematic diagram of a structure of a hybrid filter according to an exemplary embodiment of the present disclosure.

Reference signs are described as follows.

| | | |
|---|---|---|
| 10-first base substrate; | 11-first electrode; | 12-second electrode; |
| 13-piezoelectric layer; | 20-second base substrate; | 22-dielectric layer; |
| 30-film bulk acoustic resonator; | 31-first connection block; | 32-second connection block; |
| 33-third connection block; | 34-fourth connection block; | 35-fifth connection block; |
| 36-sixth connection block; | 40-passive filter; | 41-first conductive pillar; |
| 42-second conductive pillar; | 43-third conductive pillar; | 44-electrode conductive pillar; |
| 45-fifth conductive pillar; | 46-sixth conductive pillar; | 47-seventh conductive pillar; |
| 51-first connection line; | 52-second connection line; | 53-third connection line; |
| 54-fourth connection line; | 61-first electrode plate; | 62-second electrode plate; |
| 63-third electrode plate; | 64-fourth electrode plate; | 71-first terminal; |
| 72-second terminal; | 91-cavity; | 92-sacrificial layer; |
| 100-first substrate; | 200-second substrate; | 300-sealed space. |

DETAILED DESCRIPTION

To make objectives, the technical solutions, and advantages of the present disclosure clearer, the embodiments of the present disclosure will be described in detail below in combination with the accompany drawings. It is to be noted that the implementation modes may be implemented in multiple different forms. Those of ordinary skill in the art may easily understand such a fact that modes and contents may be transformed into various forms without departing from the purpose and scope of the present disclosure. Therefore, the present disclosure should not be explained as limited to contents described in following implementation modes only. The embodiments in the present disclosure and features in the embodiments may be randomly combined with each other in case of no conflict.

Scales of the drawings in the present disclosure may be used as a reference in actual processes, but are not limited thereto. For example, a width-length ratio of a channel, a thickness and a pitch of each film layer, and a width and a pitch of each signal line may be adjusted according to actual needs. A quantity of pixels in a hybrid filter and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals "first", "second", "third", etc., in the specification are set to avoid confusion of constituent elements, not to limit a quantity.

In the specification, for convenience, expressions "middle", "above", "below", "front", "back", "vertical", "horizontal", "top", "bottom", "inside", "outside", etc., indicating orientations or positional relationships are used to illustrate positional relationships between constituent elements, not to indicate or imply that a referred apparatus or element must have a specific orientation and be structured and operated with the specific orientation but only to easily describe the present specification and simply description, and thus should not be understood as limitations no the present disclosure. The positional relationships between the constituent elements are changed as appropriate according to a direction where each constituent element is described. Therefore, it is not limited to the expressions explained in the specification and appropriate replacement may be made according to a situation.

In the specification, unless otherwise specified and defined, terms "mounting", "mutual connection", and "connection" should be broadly understood. For example, it may be a fixed connection, or a detachable connection, or an integral connection. It may be a mechanical connection or an electrical connection. It may be a direct connection, or an indirect connection through an intermediate, or communication inside two elements. Those of ordinary skill in the art may understand specific meanings of the above terms in the present disclosure according to specific situations.

In the specification, an "electrical connection" includes a case that constituent elements are connected together through an element with a certain electrical action. The "element with a certain electrical action" is not particularly limited as long as electrical signals between the connected constituent elements may be sent and received. Examples of the "element with a certain electrical action" not only include an electrode and a wiring, but also include a switching element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, deformation, etc.

In the present disclosure, "about" refers to that a boundary is not defined so strictly and numerical values within process and measurement error ranges are allowed.

A Radio Frequency (RF) filter is a core device of a Radio Frequency (RF) front-end chip in wireless communication equipment, and an acoustic resonator based on piezoelectric induction is a basic element of the RF filter. The acoustic resonator based on piezoelectric induction is mainly divided into a Surface Acoustic Wave Resonator (SAWR) and a Bulk Acoustic Wave Resonator (BAWR). The bulk acoustic wave resonator has excellent characteristics such as a low insertion loss and a high quality factor, especially at frequencies above 2.0 GHz, the bulk acoustic wave resonator has obvious advantages over the surface acoustic wave resonator. In recent years, with rapid development of wireless communication technologies towards a high frequency and a high speed, and development of electronic elements towards miniaturization and low power consumption, research and development of filters based on a Film Bulk Acoustic Resonator (FBAR) has attracted more and more attention.

The Film bulk acoustic resonator has characteristics of a high quality factor value (Q value), a high working frequency, a large power capacity, a low loss, and a small volume. The Q value is a quality factor value of a resonator, which is defined as a central frequency divided by a 3 dB bandwidth of the resonator. However, due to an electromechanical coupling factor of a piezoelectric material, a passband bandwidth of the film bulk acoustic resonator is limited. In order to widen the passband bandwidth and have high out-of-band rejection at the same time, a hybrid filter combining the film bulk acoustic resonator and a non-acoustic filter is proposed. The non-acoustic filter may be a passive filter (also called an LC filter), the film bulk acoustic resonator may improve a roll-off coefficient, and the passive filter may provide a relatively wide bandwidth.

Researches show that a film bulk acoustic resonator and a passive filter in an existing hybrid filter are separated devices, they are combined together by packaging or other forms, in which leads to a relatively large size of the hybrid filter and a relatively large parasitic effect. In addition, an existing film bulk acoustic resonator uses a silicon material as a base substrate. Due to a relatively large loss angle positive value of a silicon base substrate and problems of conductivity and parasitic capacitance of the silicon base substrate, a Q value of the film bulk acoustic resonator is relatively large and an insertion loss is relatively large, which restricts overall performance of the film bulk acoustic resonator in a high frequency field to some extent.

The present disclosure provides a FBAR-LC hybrid filter including a first substrate and a second substrate disposed oppositely, wherein a first space is disposed between the first substrate and the second substrate, at least one of the first substrate and the second substrate is provided with a film bulk acoustic resonator, at least one of the first substrate and the second substrate is provided with at least one passive filter, the film bulk acoustic resonator is disposed in the first space and connected with the passive filter, the passive filter includes a filtering inductor and a filtering capacitor, and the filtering inductor is of a three-dimensional spiral inductor structure.

In an exemplary implementation mode, the first substrate at least includes a first base substrate and a first connection block disposed on a side of the first base substrate close to the second substrate, the second substrate at least includes a second base substrate and a second connection block disposed on a side of the second base substrate close to the first substrate, the first connection block and the second connection block are connected by means of bonding, the first space for accommodating the film bulk acoustic resonator is formed between the first base substrate and the second base substrate.

In an exemplary implementation mode, materials of the first base substrate and the second base substrate include glass.

In an exemplary implementation mode, the first connection block and the second connection block connected by means of bonding form a ring-shaped sealing structure on a plane parallel to the hybrid filter, and the first space is a gas-sealed and/or acoustic-sealed sealed space enclosed by the first base substrate, the second base substrate, and the ring-shaped sealing structure.

In an exemplary implementation mode, the film bulk acoustic resonator at least includes a cavity, a first electrode disposed on the first base substrate, a piezoelectric layer disposed on a side of the first electrode away from the first base substrate, and a second electrode disposed on a side of the piezoelectric layer away from the first base substrate; the cavity is a groove disposed on a side of the first substrate close to the second substrate, or the cavity is a through slot disposed on the first base substrate, or the cavity is a space enclosed by a surface of the first base substrate on a side close to the second substrate, the first electrode, and the piezoelectric layer.

In an exemplary implementation mode, a passive filter is disposed on the first substrate, the passive filter includes a filtering inductor and a filtering capacitor connected with each other.

In another exemplary implementation mode, a first passive filter is disposed on the second substrate, the first passive filter includes a first filtering inductor and a first filtering capacitor connected with each other.

In yet another exemplary implementation mode, a first passive filter and a second passive filter are disposed on the second substrate, the first passive filter and the second passive filter are disposed on both sides of the film bulk acoustic resonator, the first passive filter includes a first filtering inductor and a first filtering capacitor connected with each other, and the second passive filter includes a second filtering inductor and a second filtering capacitor connected with each other.

FIG. 1 is a schematic diagram of a structure of a hybrid filter according to an exemplary embodiment of the present disclosure, which is a single capacitor inductor structure. As shown in FIG. 1, a main body structure of the hybrid filter of the present exemplary embodiment may include a first substrate 100 and a second substrate 200 disposed oppositely, and the first substrate 100 and the second substrate 200 are fixedly connected together to form a first space 300. The first substrate 100 is provided with one film bulk acoustic resonator 30, and the second substrate 200 is provided with one passive filter 40. The film bulk acoustic resonator 30 is located in the first space 300 and connected with the passive filter 40. The passive filter 40 may at least include a filtering inductor and a filtering capacitor, and the filtering inductor may be of a three-dimensional spiral inductor structure.

In an exemplary implementation mode, the first substrate 100 may at least include a first base substrate 10 and a first connection block 31 disposed on a side of the first base substrate 10 close to the second substrate 200, and the second substrate 200 may at least include a second base substrate 20 and a second connection block 32 disposed on a side of the second base substrate 20 close to the first substrate 100, the first connection block 31 and the second connection block 32 are fixedly connected together by means of bonding to form the first space 300 between the first base substrate 10 and the second base substrate 20 for accommodating the film bulk acoustic resonator 30.

In an exemplary implementation mode, on a plane parallel to the hybrid filter, the first connection block 31 and the second connection block 32 connected by means of bonding may constitute a ring-shaped sealing structure, and the first space 300 is a gas-sealed and/or acoustic-sealed sealed space enclosed by the first base substrate 10, the second base substrate 20, and the ring-shaped sealing structure.

In an exemplary implementation mode, materials of the first base substrate 10 and the second base substrate 20 may include glass. The first base substrate 10 may include a first side surface on a side close to the second base substrate 20 and a second side surface on a side away from the second base substrate 20, and the second base substrate 20 may include a third side surface on a side close to the first base substrate 10 and a fourth side surface on a side away from the first base substrate 10.

In an exemplary implementation mode, the film bulk acoustic resonator 30 may be disposed on the first side surface of the first base substrate 10, and may at least include a first electrode 11 disposed on the first base substrate 10, a piezoelectric layer 13 disposed on a side of the first electrode 11 away from the first base substrate, and a second electrode 12 disposed on a side of the piezoelectric layer 13 away from the first base substrate. An orthographic projection of the first electrode 11 on the first base substrate 10, an orthographic projection of the piezoelectric layer 13 on the first base substrate 10, and an orthographic projection of the second electrode 12 on the first base substrate 10 have a first overlapping region.

In an exemplary implementation mode, the first side surface of the first base substrate 10 is provided with a cavity 91 and the first electrode 11 covers at least a portion of the cavity 91.

In an exemplary implementation mode, the cavity 91 may be a groove disposed on a side surface of the first base substrate 10 close to the second substrate 200, forming a downward-concave-typed cavity, and the first overlapping region of the first electrode 11, the piezoelectric layer 13, and the second electrode 12 is at least partially overlapped with an orthographic projection of the cavity 91 on the first base substrate 10.

In an exemplary implementation mode, the filtering inductor with the three-dimensional spiral inductor structure may be disposed on the second substrate 200, and the filtering inductor may at least include a first conductive pillar 41, a second conductive pillar 42, a third conductive pillar 43, a first connection line 51, and a second connection line 52.

In an exemplary implementation mode, a first through hole, a second through hole, and a third through hole penetrating through the second base substrate 20 in a thickness direction are disposed on the second base substrate 20; the first conductive pillar 41, the second conductive pillar 42, and the third conductive pillar 43 are respectively disposed in the first through hole, the second through hole, and the third through hole; the first connection line 51 may be disposed on the fourth side surface of the second base substrate 20 and is connected with one end of the first conductive pillar 41 and one end of the second conductive pillar 42 away from the first base substrate 10, respectively; the second connection line 52 may be disposed on the third side surface of the second base substrate 20 and is connected with one end of the second conductive pillar 42 and one end of the third conductive pillar 43 close to the first base substrate 10, respectively; the first conductive pillar 41, the first connection line 51, the second conductive pillar 42, the second connection line 52, and the third conductive pillar 43 constitute the filtering inductor of the three-dimensional spiral inductor structure.

In an exemplary implementation mode, a filtering capacitor of a parallel plate capacitor structure may be disposed on the second substrate 200, and the filtering capacitor may at least include a first electrode plate 61, a second electrode plate 62, and a dielectric layer 22 disposed between the first electrode plate 61 and the second electrode plate 62.

In an exemplary implementation mode, the first electrode plate 61 may be disposed on the fourth side surface of the second base substrate 20 and connected with one end of the third conductive pillar 43 away from the first base substrate 10, the dielectric layer 22 may be disposed on a side of the first electrode plate 61 away from the second base substrate 20, the second electrode plate 62 may be disposed on a side of the dielectric layer 22 away from the second base substrate 20, and an orthographic projection of the first electrode plate 61 on the second base substrate 20 is at least partially overlapped with an orthographic projection of the second electrode plate 62 on the second base substrate 20 to form the filtering capacitor of the parallel plate capacitor structure.

In an exemplary implementation mode, the second substrate 200 may further include a first terminal 71 and a second terminal 72 of the hybrid filter. The first terminal 71 may be disposed on the fourth side surface of the second base substrate 20 and connected with the first electrode 11 of the film bulk acoustic resonator 30. The second terminal 72 may be disposed on a side of the dielectric layer 22 away from the second base substrate 20 and connected with the second electrode plate 62 of the passive filter 40.

In an exemplary implementation mode, the first connection line 51, the first electrode plate 61, and the first terminal 71 may be disposed in a same layer and formed synchronously through a same process.

In an exemplary implementation mode, the second electrode plate 62 and the second terminal 72 may be disposed in a same layer and be of an integral structure connected with each other.

In an exemplary implementation mode, the first substrate 100 may further include a third connection block 33, and the second substrate 200 may further include a fourth connection block 34 and an electrode conductive pillar 44. The second base substrate 20 may be provided with a fourth through hole that penetrates through the second base substrate 20 in a thickness direction, and the electrode conductive pillar 44 is disposed in the fourth through hole, and one end of the electrode conductive pillar 44 away from the first base substrate 10 is connected with the first terminal 71. The fourth connection block 34 may be disposed on the third side surface of the second base substrate 20 and connected with one end of the electrode conductive pillar 44 close to the first base substrate 10. The third connection block 33 may be disposed on a side of the first electrode 11 away from the first base substrate 10 and fixedly connected with the fourth connection block 34 by means of bonding, so that the first electrode 11 of the film bulk acoustic resonator 30 is connected with the first terminal 71 through the third connection block 33, the fourth connection block 34, and the electrode conductive pillar 44.

In an exemplary implementation mode, the first substrate 100 may further include a fifth connection block 35, and the second substrate 200 may further include a sixth connection block 36. The sixth connection block 36 may be disposed on the third side surface of the second base substrate 20 and connected with one end of the first conductive pillar 41 close to the first base substrate 10. The fifth connection block 35 may be disposed on a side of the second electrode 12 away from the first base substrate 10 and fixedly connected with the sixth connection block 36 by means of bonding, so that the second electrode 12 of the film bulk acoustic resonator 30 is connected with the filtering inductor of the passive filter 40 through the fifth connection block 35 and the sixth connection block 36.

In an exemplary implementation mode, the first connection block 31, the third connection block 33, and the fifth connection block 35 may be disposed in a same layer and formed synchronously through a same process.

In an exemplary implementation mode, the second connection block 32, the fourth connection block 34, the sixth connection block 36, and the second connection line 52 may be disposed in a same layer and formed synchronously through a same process.

In an exemplary implementation mode, a quantity of conductive pillars and connection lines included in the filtering inductor may be set according to a parameter such as an inductance amount (e.g., a quantity of coil turns).

In an exemplary implementation mode, n through holes penetrating through the second base substrate 20 in a thickness direction may be disposed on the second base substrate 20, n conductive pillars are respectively disposed in the n through holes, and the n conductive pillars may be regularly arranged along a predefined direction. A side of the second base substrate 20 away from the first substrate 100 may be provided with (n−1)/2 first connection lines 51, a side of the second base substrate 20 close to the first substrate 100 may be provided with (n−1)/2 second connection lines 52, a plurality of first connection lines 51 may respectively connect an i-th conductive pillar and an (i+1)-th conductive pillar among the n conductive pillars, a plurality of second connection lines 52 may respectively connect the (i+1)-th conductive pillar and an (i+2)-th conductive pillar among the n conductive pillars, the n conductive pillars, the (n−1)/2 first connection lines 51, and the (n−1)/2 second connection lines 52 constitute the first filtering inductor of the three-dimensional spiral inductor structure, wherein n is an odd number greater than 1, and i is a positive integer greater than or equal to 1 and less than or equal to n−2.

In an exemplary implementation mode, a first conductive pillar among the n conductive pillars may be connected with the second electrode 12 of the film bulk acoustic resonator, and an n-th conductive pillar among the n conductive pillars may be connected with the first electrode plate 61 of the filtering capacitor.

Exemplary description is given below through a preparation process of the hybrid filter. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need a patterning process in an entire preparation process, the "thin film" may also be called a "layer". If the "thin film" needs the patterning process in the entire preparation process, the "thin film" is called a "thin film" before the patterning process and is called a "layer" after the patterning process. At least one "pattern" is contained in the "layer" after the patterning process. "A and B are disposed in a same layer" in the present disclosure means that A and B are formed simultaneously through a same patterning process, and a "thickness" of a film layer is a dimension of the film layer in a direction perpendicular to the hybrid filter. In an exemplary embodiment of the present disclosure, "an orthographic projection of B is within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

The preparation process of the hybrid filter according to an exemplary embodiment of the present disclosure may include at least three sections, which are preparation of a first substrate, preparation of a second substrate, and a bonding processing, respectively. Among them, the preparation of the first substrate and the preparation of the second substrate have no sequence requirement and may be carried out simultaneously, while the bonding processing needs to be carried out after the preparation of the first substrate and the preparation of the second substrate are completed. The following describes preparation processes of the three sections respectively.

The first section: the preparation of the first substrate.

In an exemplary implementation mode, the preparation process of the first substrate may include following operations.

Figure 2:
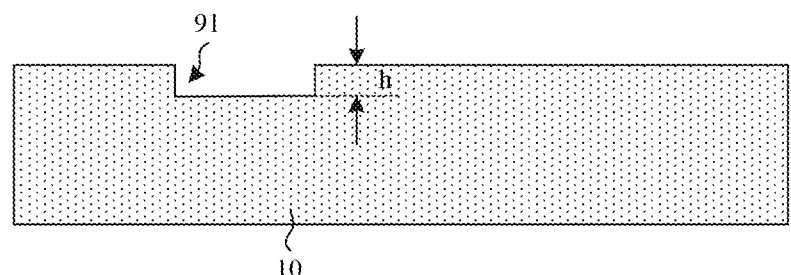
FIG. 2 is a schematic diagram after forming a pattern of a cavity in a hybrid filter of the present disclosure.

(11) Preparing a pattern of a first base substrate. In an exemplary implementation mode, the preparing the pattern of the first base substrate may include: first providing a first base substrate 10 and then forming a cavity 91 on the first base substrate 10 using a patterning process, as shown in FIG. 2.

In an exemplary implementation mode, the first base substrate 10 may include a first side surface and a second side surface that face away from each other, the first side surface may be a surface that is close to the second substrate, the second side surface may be a surface that is away from the second substrate, and the cavity 91 may be disposed on the first side surface.

In an exemplary implementation mode, the forming the cavity 91 on the first base substrate 10 using the patterning process may include: first coating a layer of photoresist on the first side surface of the first base substrate 10, exposing the photoresist using a mask, forming an exposed region and an unexposed region after development, removing the photoresist in the exposed region, revealing the first side surface of the first base substrate 10 with the unexposed region being still covered with the photoresist; etching the first base substrate 10 of the exposed region using a dry etching process or a wet etching process, striping off the photoresist, and forming the cavity 91 on the first side surface of the first base substrate 10, wherein the cavity 91 is configured as an acoustic reflection structure of the film bulk acoustic resonator.

In an exemplary implementation mode, a material of the first base substrate may be glass, such as silicon oxide, silicon dioxide, or photosensitive glass.

In an exemplary implementation mode, a depth h of the cavity 91 may be about 0.5 μm to 2 μm.

In an exemplary implementation mode, on a plane parallel to the first base substrate, a shape of the cavity 91 may be any one or more of following: a rectangle, a pentagon, a hexagon, a circle, and an ellipse. For example, the shape of the cavity 91 may be a square, and a side length of the cavity 91 may be about 50 μm*50 μm to 500 μm*500 μm.

Figure 3:
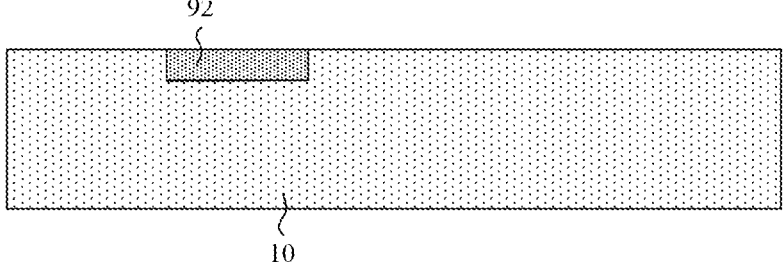
FIG. 3 is a schematic diagram after forming a pattern of a sacrificial layer in a hybrid filter of the present disclosure.

(12) Forming a pattern of a sacrificial layer. In an exemplary implementation mode, forming the pattern of the sacrificial layer may include: depositing a sacrificial thin film on the first side surface on the first base substrate where the aforementioned pattern is formed, wherein a thickness of the sacrificial thin film may be greater than the depth of the cavity 91, so that the sacrificial thin film completely fills the cavity 91, and then performing a thinning and polishing process on the sacrificial thin film using Chemical Mechanical Polishing (CMP) to remove the sacrificial thin film outside the cavity 91, forming a sacrificial layer 92 in the cavity 91 of the first base substrate 10, wherein a surface of the sacrificial layer 92 is flush with the first side surface of the first base substrate 10, as shown in FIG. 3.

In an exemplary implementation mode, the thickness of the sacrificial thin film may be about 0.6 μm to 2.2 μm, i.e. the thickness of the sacrificial thin film is about 0.1 μm to about 0.2 μm greater than the depth h of the cavity 91, so as to facilitate a subsequent thinning process.

In an exemplary implementation mode, a material of the sacrificial layer 92 may be amorphous silicon, silicon oxide, phosphosilicate glass, or the like, and may be deposited by means of Physical Vapor Deposition (PVD), or Chemical Vapor Deposition (CVD), or the like.

In an exemplary implementation mode, a surface roughness of the sacrificial layer 92 may be less than or equal to 1 nm.

Figure 4:
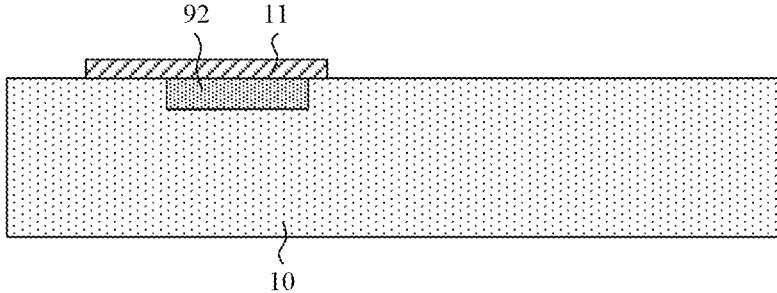
FIG. 4 is a schematic diagram after forming a pattern of a first conductive layer in a hybrid filter of the present disclosure.

(13) Forming a pattern of a first conductive layer. In an exemplary implementation mode, forming the pattern of the first conductive layer may include: depositing a first conductive thin film on the first base substrate where the aforementioned patterns are formed, patterning the first conductive thin film using a patterning process to form the pattern of the first conductive layer on the first side surface of the first base substrate 10, as shown in FIG. 4.

In an exemplary implementation mode, the first conductive layer may at least include a first electrode 11, and the first electrode 11 may cover at least a portion of the sacrificial layer 92 and expose at least a portion of the sacrificial layer 92, an orthographic projection of the first electrode 11 on the first base substrate is partially overlapped with an orthographic projection of the sacrificial layer 92 on the first base substrate.

In an exemplary implementation mode, a thickness of the first electrode 11 may be about 0.1 μm to 0.3 μm.

In an exemplary implementation mode, a material of the first electrode 11 may be a metal material, such as Wolfram (W) or Molybdenum (Mo), and may be deposited by means of physical vapor deposition.

In an exemplary implementation mode, a Lift-Off process may also be used for forming the pattern of the first conductive layer. For example, photoresist is first coated on the first base substrate, and a pattern of photoresist is formed after exposure and development, then the first conductive thin film is deposited, then the pattern of photoresist and the first conductive thin film on the pattern of photoresist are stripped off, and the first conductive layer including the first electrode 11 is formed on the first base substrate.

Figure 5:
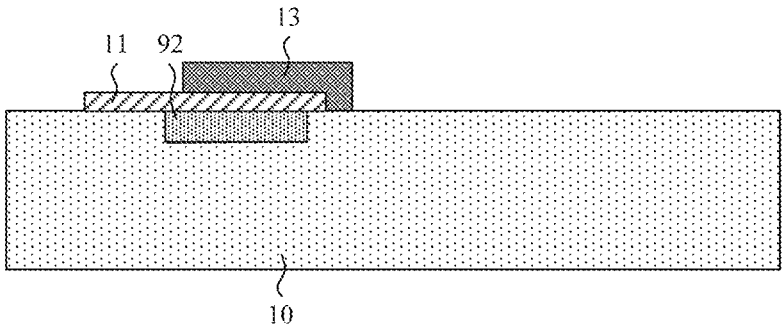
FIG. 5 is a schematic diagram after forming a pattern of a piezoelectric layer in a hybrid filter of the present disclosure.

(14) Forming a pattern of a piezoelectric layer. In an exemplary implementation mode, forming the pattern of the piezoelectric layer may include: depositing a piezoelectric thin film on the first base substrate where the aforementioned patterns are formed, patterning the piezoelectric thin film using a patterning process to form a pattern of a piezoelectric layer 13 on the first base substrate 10 and the first electrode 11, as shown in FIG. 5.

In an exemplary implementation mode, one portion of the piezoelectric layer 13 is disposed on a surface of the first electrode 11 on a side away from the first base substrate 10, the other portion of the piezoelectric layer 13 is disposed on a surface of the first base substrate 10, and an orthographic projection of the piezoelectric layer 13 on the first base substrate is at least partially overlapped with an orthographic projection of the sacrificial layer 92 on the first base substrate.

In an exemplary implementation mode, a material of the piezoelectric layer 13 may be aluminum nitride, zinc oxide, lead zirconate titanate (PZT), potassium sodium niobate (KNN), or the like, and may be deposited by means of physical vapor deposition to form a low-stress piezoelectric layer. The piezoelectric layer 13 is a core film layer of the film bulk acoustic resonator, and is configured to generate resonance under an action of high-frequency alternating voltages of the first electrode and the second electrode, thereby achieving a function of a resonator.

Figure 6:
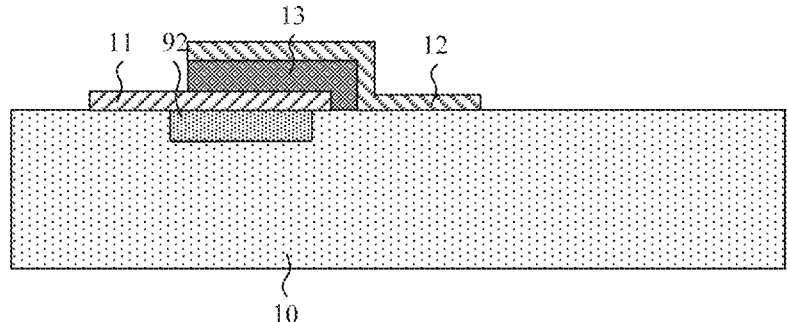
FIG. 6 is a schematic diagram after forming a pattern of a second conductive layer in a hybrid filter of the present disclosure.

(15) Forming a pattern of a second conductive layer. In an exemplary implementation mode, forming the pattern of the second conductive layer may include: depositing a second conductive thin film on the first base substrate where the aforementioned patterns are formed, patterning the second conductive thin film using a patterning process to form the pattern of the second conductive layer on the first base substrate 10 and the piezoelectric layer 13, as shown in FIG. 6.

In an exemplary implementation mode, the second conductive layer may at least include a second electrode 12, and one portion of the second electrode 12 is disposed on a surface of the piezoelectric layer 13 on a side away from the first base substrate 10, the other portion of the second electrode 12 is disposed on a surface of the first base substrate 10, and an orthographic projection of the second electrode 12 on the first base substrate is at least partially overlapped with an orthographic projection of the piezoelectric layer 13 on the first base substrate.

In an exemplary implementation mode, the orthographic projection of the first electrode 11 on the first base substrate, the orthographic projection of the piezoelectric layer 13 on the first base substrate, and the orthographic projection of the second electrode 12 on the first base substrate have a first overlapping region, and the first overlapping region is partially overlapped with the orthographic projection of the sacrificial layer 92 on the first base substrate.

In an exemplary implementation mode, a thickness of the second electrode 12 may be about 0.1 μm to 0.3 μm.

In an exemplary implementation mode, a material of the second electrode 12 may be a metal material, such as Wolfram (W) or Molybdenum (Mo), and may be deposited by means of physical vapor deposition.

In an exemplary implementation mode, a Lift-Off process may also be used for preparing the pattern of the second electrode.

Figure 7:
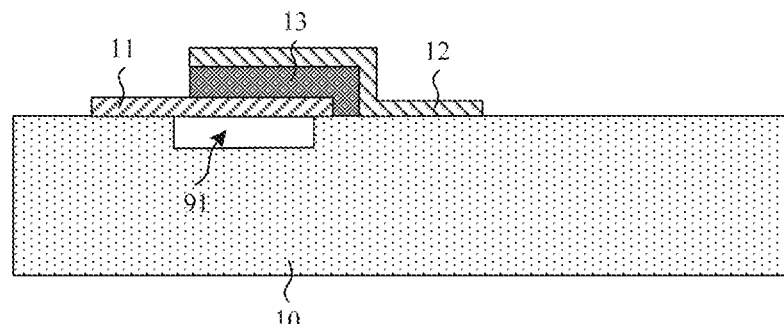
FIG. 7 is a schematic diagram after releasing a sacrificial layer in a hybrid filter of the present disclosure.

(16) Forming a pattern of a cavity. In an exemplary implementation mode, forming the pattern of the cavity may include: etching away the sacrificial layer (i.e. releasing the sacrificial layer) using a dry etching process or a wet etching process on the first base substrate where the aforementioned patterns are formed to form the cavity 91, as shown in FIG. 7.

In an exemplary implementation mode, the first electrode 11, the second electrode 12, and the piezoelectric layer 13 may constitute the film bulk acoustic resonator. The first overlapping region in which the first electrode 11, the second electrode 12, and the piezoelectric layer 13 are overlapped is partially placed above the cavity 91 of the first base substrate 10, longitudinal and transverse bulk acoustic elastic vibrations will be generated in a body and on a surface of the piezoelectric layer 13 with a thin film structure under an action of an alternating electric field generated by the first electrode 11 and the second electrode 12, thus converting electrical energy into acoustic waves and forming resonance.

In an exemplary implementation mode, the film bulk acoustic resonator may include a fixed portion and a cantilever portion, the fixed portion is fixedly connected with a surface of the first base substrate 10, the cantilever portion is disposed above the cavity 91, and the cantilever portion exposes a portion of the cavity 91.

Figure 8:
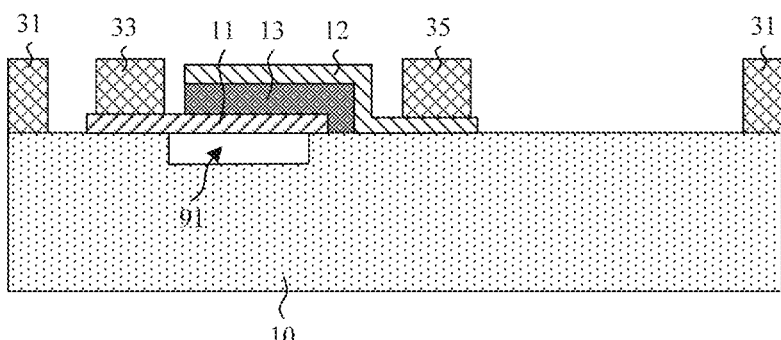
FIG. 8 is a schematic diagram after forming a pattern of a first bonding layer in a hybrid filter of the present disclosure.

(17) Forming a pattern of a first bonding layer. In an exemplary implementation mode, forming the pattern of the first bonding layer may include: depositing a first bonding thin film on the first base substrate where the aforementioned patterns are formed, and patterning the first bonding thin film using a patterning process to form the pattern of the first bonding layer, as shown in FIG. 8.

In an exemplary implementation mode, the first bonding layer may at least include a first connection block 31, a third connection block 33, and a fifth connection block 35.

In an exemplary implementation mode, the first connection block 31 may be disposed on the first side surface of the first base substrate 10 and located at an edge of the first base substrate 10, and the first connection block 31 is configured to be fixedly connected with the second connection block by means of bonding to form a ring-shaped sealing structure so that the first base substrate, the second base substrate, and the ring-shaped sealing structure enclose a gas-sealed and/or acoustic-sealed first space.

In an exemplary implementation mode, a shape of the first connection block 31 may be a ring shape extending along the edge of the first base substrate 10 on a plane parallel to the first base substrate, and a cross-sectional shape of the first connection block 31 may be a rectangular shape or a trapezoidal shape on a plane perpendicular to the first base substrate.

In an exemplary implementation mode, the third connection block 33 may be disposed on a side of the first electrode 11 away from the first base substrate 10, and the third connection block 33 is configured to be fixedly connected with a fourth connection block by means of bonding to achieve a connection between the first electrode 11 and a first terminal of the hybrid filter.

In an exemplary implementation mode, on a plane parallel to the first base substrate, a shape of the third connection block 33 may be any one or more of following: a triangle, a rectangle, a pentagon, a hexagon, a circle, and an ellipse, and on a plane perpendicular to the first base substrate, a cross-sectional shape of the third connection block 33 may be a rectangular shape or a trapezoidal shape.

In an exemplary implementation mode, the fifth connection block 35 may be disposed on a side of the second electrode 12 away from the first base substrate 10, and the fifth connection block 35 is configured to be fixedly connected with a sixth connection block by means of bonding to achieve a connection between the second electrode 12 and a filtering inductor of the hybrid filter.

In an exemplary implementation mode, on a plane parallel to the first base substrate, a shape of the fifth connection block 35 may be any one or more of following: a triangle, a rectangle, a pentagon, a hexagon, a circle, and an ellipse, and on a plane perpendicular to the first base substrate, a cross-sectional shape of the fifth connection block 35 may be a rectangular shape or a trapezoidal shape.

In an exemplary implementation mode, a material of the first bonding layer may be a composite layer of Titanium (Ti) and Aurum (Au), or a composite layer of Chromium (Cr) and Aurum (Au), and may be deposited by means of physical vapor deposition.

In an exemplary implementation mode, a thickness of an aurum layer in the first bonding layer may be about 0.02 μm to 0.05 μm, and a thickness of a titanium layer or a chromium layer in the first bonding layer may be about 1.5 μm to 2.0 μm.

In an exemplary implementation mode, a Lift-Off process may also be adopted for forming the pattern of the first bonding layer.

In an exemplary implementation mode, after the pattern of the first bonding layer is formed, surfaces of the first connection block 31, the third connection block 33, and the fifth connection block 35 on a side away from the first base substrate may be polished by means of chemical mechanical polishing so that the surfaces of the first connection block 31, the third connection block 33, and the fifth connection block 35 are flush, and a surface roughness of the surfaces of the first connection block 31, the third connection block 33, and the fifth connection block 35 on a side away from the first base substrate may be less than or equal to 1 nm.

The second section: the preparation of the second substrate.

In an exemplary implementation mode, a preparation process of the second substrate may include following operations.

Figure 9:
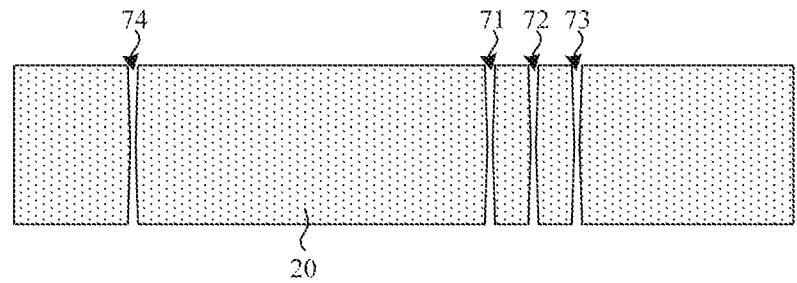
FIG. 9 is a schematic diagram after forming patterns of a plurality of through holes in a hybrid filter of the present disclosure.

(21) Preparing a pattern of a second base substrate. In an exemplary implementation mode, preparation the pattern of the second base substrate may include: first providing a second base substrate 20, and then forming patterns of a plurality of through holes on the second base substrate 20, as shown in FIG. 9.

In an exemplary implementation mode, the second base substrate 20 may include a third side surface and a fourth side surface facing away from each other, the third side surface may be a surface on a side close to the first substrate 100, the fourth side surface may be a surface on a side away from the first substrate 100, and the plurality of through holes may be of a through hole structure penetrating through the third side surface and the fourth side surface.

In an exemplary implementation mode, the patterns of the plurality of through holes may at least include a first through hole 71, a second through hole 72, a third through hole 73, and a fourth through hole 74. The fourth through hole 74 may be located on one side of the second base substrate 20 (a left side as shown in FIG. 9), the first through hole 71, the second through hole 72, and the third through hole 73 may be located on the other side of the second base substrate 20 (a right side as shown in FIG. 9), and the first through hole 71, the second through hole 72, and the third through hole 73 are sequentially disposed along a direction away from the fourth through hole 74.

In an exemplary implementation mode, structures of the first through hole 71 to the fourth through hole 74 may be substantially the same and all be through hole structures penetrating through the second base substrate 20 in a thickness direction.

In an exemplary implementation mode, on a plane parallel to the second base substrate, cross-sectional shapes of the first through hole 71 to the fourth through hole 74 may be circular shapes, and a diameter of a circular through hole may be about 80 μm to 100 μm. On a plane perpendicular to the second base substrate, the cross-sectional shapes of the first through hole 71 to the fourth through hole 74 may be pillar shapes. The first through hole 71 is configured to accommodate a first conductive pillar formed subsequently, the second through hole 72 is configured to accommodate a second conductive pillar formed subsequently, the third through hole 73 is configured to accommodate a third conductive pillar formed subsequently, and the fourth through hole 74 is configured to accommodate an electrode conductive pillar formed subsequently.

In an exemplary implementation mode, a material of the second base substrate may be glass, such as silicon oxide, silicon dioxide, or photosensitive glass.

Figure 10:
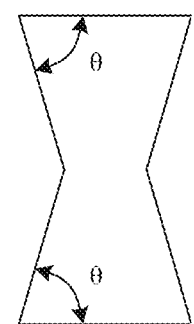
FIG. 10 is a schematic diagram of a structure of a through hole according to an exemplary embodiment of the present disclosure.

In an exemplary implementation mode, a diameter of each through hole may be the same or may be different along a thickness direction of the second base substrate. FIG. 10 is a schematic diagram of a structure of a through hole according to an exemplary embodiment of the present disclosure. As shown in FIG. 10, on a plane perpendicular to the second base substrate, a diameter of the through hole close to a surface of the second base substrate 20 is larger than a diameter of the through hole away from the surface of the second base substrate 20, forming an hourglass-shaped through hole.

In an exemplary implementation mode, an angle θ between a sidewall of the through hole and the surface of the second base substrate 20 may be about 80 degrees to 88 degrees.

In an exemplary implementation mode, a patterning process may be used, or a laser punching process may be used, for forming the patterns of the plurality of through holes on the second base substrate 20.

In an exemplary implementation mode, taking the hourglass-shaped through hole as an example, forming at least one through hole on the second base substrate using a patterning process may include: first coating a layer of photoresist on a first side surface of the second base substrate, exposing and developing the photoresist to form an exposed region and an unexposed region, removing the photoresist in the exposed region, and revealing the first side surface of the second base substrate with the unexposed region still being covered with the photoresist; etching the second base substrate of the exposed region using a dry etching process or a wet etching process, and forming a plurality of first blind holes on this side surface of the second base substrate, wherein a cross-sectional shape of a first blind hole may be a trapezoidal shape; then, coating a layer of photoresist on a second side surface of the second base substrate, exposing and developing the photoresist to form an exposed region and an unexposed region, removing the photoresist in the exposed region, and revealing the second side surface of the second base substrate with the unexposed region still being covered with photoresist; etching the second base substrate of the exposed region using a dry etching process or a wet etching process, and forming a plurality of second blind holes on this side surface of the second base substrate, wherein a cross-sectional shape of a second blind hole may be a trapezoidal shape, and the second blind hole is communicated with the first blind hole to form the hourglass-shaped through hole.

In an exemplary implementation mode, taking the hourglass-shaped through hole as an example, forming at least one through hole on the second base substrate using a laser punching process may include: firstly irradiating the first side surface of the second base substrate using a laser in a mode of vertical incidence of a laser beam to form a first blind hole in a shape of an inverted circular truncated cone on this side surface of the second base substrate, then irradiating the second side surface of the second base substrate using a laser in a mode of vertical incidence of a laser beam to form a second blind hole in a shape of an inverted circular truncated cone on this side surface of the second base substrate, wherein the second blind hole is communicated with the first blind hole to form the hourglass-shaped through hole. When the laser beam interacts with the second base substrate, laser photons with higher energy ionize atoms in the second base substrate and toss them out of the second base substrate. With increase of time, holes gradually deepen until the first blind hole and the second blind hole are formed.

In an exemplary implementation mode, a type of the laser may be selected from a continuous laser, a pulsed laser, etc., a wavelength of the laser may be about 532 nm, 355 nm, 266 nm, 248 nm, 197 nm, etc., and a pulse width of the laser may be selected from 1 fs to 100 fs, 1 ps to 100 ps, 1 ns to 100 ns, etc.

In an exemplary implementation mode, ways of laser drilling may include, but are not limited to, following two. In a first way, when a diameter of a laser spot is relatively large, relative positions of the laser beam and the second base substrate are fixed, and the second base substrate is directly hit to a preset depth by high energy. In a second way, when the diameter of the laser spot is relatively small, the laser beam scans in a circle on the second base substrate, a radius of the circle gradually decreases, a focus point of the spot is constantly changing, and a depth the focus point is constantly changing, so that the second base substrate is hit to a preset depth.

Figure 11:
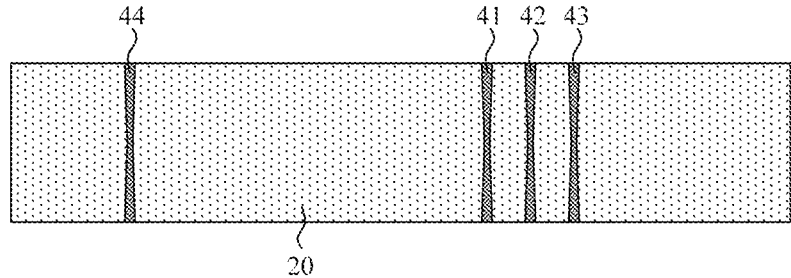
FIG. 11 is a schematic diagram after forming a pattern of a conductive pillar in a hybrid filter of the present disclosure.

(22) Forming patterns of conductive pillars. In an exemplary implementation mode, forming the patterns of the conductive pillars may include: forming patterns of a plurality of conductive pillars in the plurality of through holes using a filling process on the second base substrate where the aforementioned patterns are formed, as shown in FIG. 11.

In an exemplary implementation mode, the patterns of the conductive pillar patterns may at least include a first conductive pillar 41, a second conductive pillar 42, a third conductive pillar 43, and an electrode conductive pillar 44. The first conductive pillar 41 may be disposed in the first through hole 71 and configured to be respectively connected with a first connection line and a sixth connection block formed subsequently, the second conductive pillar 42 may be disposed in the second through hole 72 and configured to be respectively connected with the first connection line and a second connection line formed subsequently, the third conductive pillar 43 may be disposed in the third through hole 73 and configured to be respectively connected with a first electrode plate and the second connection line formed subsequently, and the electrode conductive pillar 44 may be disposed in the fourth through hole 74 and configured to be respectively connected with a first terminal and a fourth connection block formed subsequently.

In an exemplary implementation mode, structures of the first conductive pillar 41, the second conductive pillar 42, the third conductive pillar 43, and the electrode conductive pillar 44 may be substantially the same. Each conductive pillar may include a conductive layer and an adhesive layer located outside the conductive layer, and the adhesive layer is connected with an inner wall of a through hole. A preparation process of a conductive pillar may include: firstly, forming an adhesive layer on an inner wall of a through hole using physical vapor deposition or chemical vapor deposition, and then forming a conductive layer in the adhesive layer using an electroplating process.

In an exemplary implementation mode, a material of the adhesive layer may be a metallic material such as Titanium (Ti) or Chromium (Cr), and a thickness of the adhesive layer may be about 0.02 μm to 0.05 μm.

In an exemplary implementation mode, a material of the conductive layer may be Copper (Cu), and a thickness of the conductive layer may be about 0.2 μm to 0.5 μm.

Figure 12:
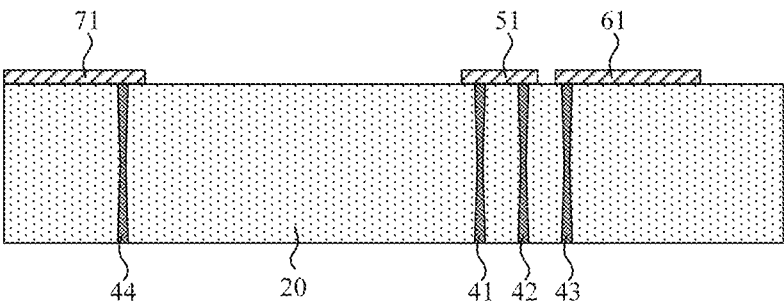
FIG. 12 is a schematic diagram after forming a pattern of a third conductive layer in a hybrid filter of the present disclosure.

(23) Forming a pattern of a third conductive layer. In an exemplary implementation mode, forming the pattern of the third conductive layer may include: depositing a third conductive thin film on a fourth side surface on the second base substrate where the aforementioned patterns are formed, patterning the third conductive thin film through a patterning process, and forming the pattern of the third conductive layer on the fourth side surface of the second base substrate, as shown in FIG. 12.

In an exemplary implementation mode, the pattern of the third conductive layer may at least include a first connection line 51, a first electrode plate 61, and a first terminal 71.

In an exemplary implementation mode, the first terminal 71 may be located on one side of the second base substrate 20 (a left side as shown in FIG. 9), the first terminal 71 is connected with one end of the electrode conductive pillar 44 located on the fourth side surface (one end away from the first substrate), and the first terminal 71 is configured as an input terminal of the hybrid filter.

In an exemplary implementation mode, the first electrode plate 61 may be located on the other side of the second base substrate 20 (a right side as shown in FIG. 9), the first electrode plate 61 is connected with one end of the third conductive pillar 43 located on the fourth side surface, and the first electrode plate 61 is configured as one electrode plate (lower electrode plate) of the filtering capacitor.

In an exemplary implementation mode, the first connection line 51 may be located between the first terminal 71 and the first electrode plate 61, the first connection line 51 is connected with one end of the first conductive pillar 41 located on the fourth side surface and one end of the second conductive pillar 42 located on the fourth side surface, respectively, and the first connection line 51 is configured as one connection line of the filtering inductor.

In an exemplary implementation mode, the third conductive thin film may be a composite layer of Titanium (Ti) and Aurum (Au), or a composite layer of Chromium (Cr) and Aurum (Au), and may be deposited by means of physical vapor deposition.

In an exemplary implementation mode, a thickness of an aurum layer in the third conductive layer may be about 0.02 μm to 0.05 μm, and a thickness of a titanium layer or a chromium layer in the third conductive layer may be about 0.2 μm to 2.0 μm.

In an exemplary implementation mode, a Lift-Off process may also be adopted for preparing the third conductive layer.

Figure 13:
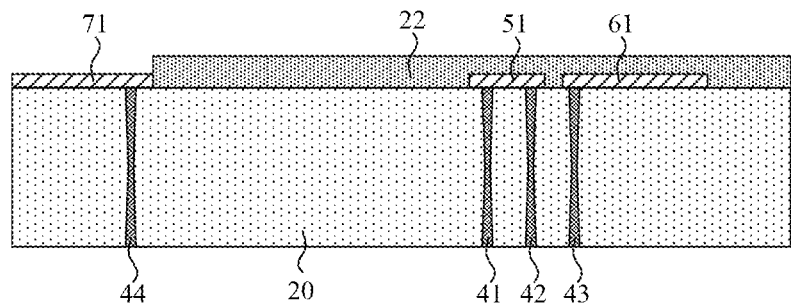
FIG. 13 is a schematic diagram after forming a pattern of a dielectric layer in a hybrid filter of the present disclosure.

(24) Forming a pattern of a dielectric layer. In an exemplary implementation mode, forming the pattern of the dielectric layer may include: depositing a capacitive dielectric thin film on the fourth side surface on the second base substrate where the aforementioned patterns are formed, patterning the capacitive dielectric thin film through a patterning process, and forming a pattern of a dielectric layer 22 covering the first connection line 51 and the first electrode plate 61, as shown in FIG. 13.

In an exemplary implementation mode, an orthographic projection of the dielectric layer 22 on the second base substrate may include orthographic projections of the first connection line 51 and the first electrode plate 61 on the second base substrate, i.e., the dielectric layer 22 completely covers the first electrode plate 61 and the first connection line 51.

In an exemplary implementation mode, the orthographic projection of the dielectric layer 22 on the second base substrate is not overlapped with an orthographic projection of the first terminal 71 on the second base substrate, i.e., the dielectric layer 22 does not cover the first terminal 71.

In an exemplary implementation mode, a material of the dielectric layer 22 may be an inorganic insulation material such as silicon oxide, silicon nitride, alumina, tantalum oxide, barium titanate, titanium oxide, or lead zirconate titanate, or may be an organic insulation material such as Polyimide (PI) or photosensitive epoxy resin photoresist (e.g., SU8), chemical vapor deposition or another manner may be adopted for the inorganic insulation material, and coating or another manner may be adopted for the organic insulation material.

Figure 14:
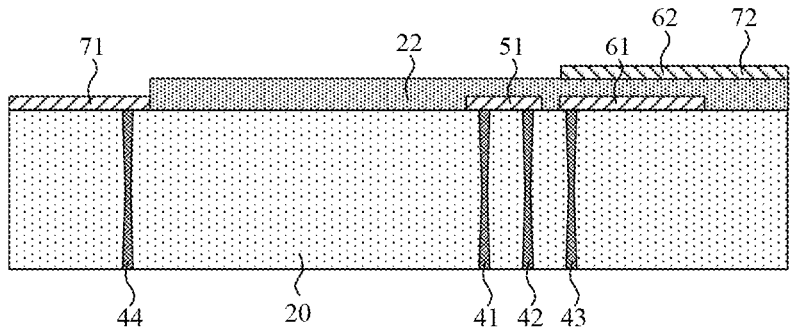
FIG. 14 is a schematic diagram after forming a pattern of a fourth conductive layer in a hybrid filter of the present disclosure.

(25) Forming a pattern of a fourth conductive layer. In an exemplary implementation mode, forming the pattern of the fourth conductive layer may include: depositing a fourth conductive thin film on the fourth side surface on the second base substrate where the aforementioned patterns are formed, patterning the fourth conductive thin film through a patterning process, and forming the pattern of the fourth conductive layer, as shown in FIG. 14.

In an exemplary implementation mode, the pattern of the fourth conductive layer may at least include a second electrode plate 62 and a second terminal 72.

In an exemplary implementation mode, the second electrode plate 62 may be disposed on a side of the dielectric layer 22 away from the second base substrate, an orthographic projection of the second electrode plate 62 on the second base substrate is at least partially overlapped with an orthographic projection of the first electrode plate 61 on the second base substrate, the second electrode plate 62 is configured as the other electrode plate (upper electrode plate) of the filtering capacitor, and the first electrode plate 61, the second electrode plate 62, and the dielectric layer 22 disposed between the first electrode plate 61 and the second electrode plate 62 may constitute a filtering capacitor with a parallel plate capacitor structure.

In an exemplary implementation mode, the second terminal 72 may be disposed on a side of the dielectric layer 22 away from the second base substrate, the second terminal 72 is connected with the second electrode plate 62, and the second terminal 72 is configured as an output terminal of the hybrid filter.

In an exemplary implementation mode, the second electrode plate 62 and the second terminal 72 may be of an integral structure connected with each other.

In an exemplary implementation mode, a material of the fourth conductive thin film may be a composite layer of Titanium (Ti) and Aurum (Au), or may be a composite layer of Chromium (Cr) and Aurum (Au), and may be deposited by means of physical vapor deposition.

In an exemplary implementation mode, a thickness of an aurum layer in the fourth conductive layer may be about 0.02 μm to 0.05 μm, and a thickness of a titanium layer or a chromium layer in the fourth conductive layer may be about 0.2 μm to 2.0 μm.

In an exemplary implementation mode, a Lift-Off process may also be adopted for preparing the fourth conductive layer.

Figure 15:
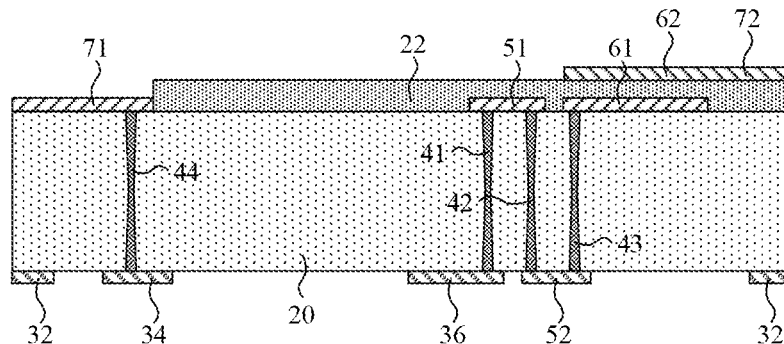
FIG. 15 is a schematic diagram after forming a pattern of a second bonding layer in a hybrid filter of the present disclosure.

(26) Forming a pattern of a second bonding layer. In an exemplary implementation mode, forming the pattern of the second bonding layer may include: depositing a second bonding thin film on a third side surface of the second base substrate, patterning the second bonding thin film using a patterning process, and forming the pattern of the second bonding layer, as shown in FIG. 15.

In an exemplary implementation mode, the second bonding layer may at least include a second connection block 32, a fourth connection block 34, a sixth connection block 36, and a second connection line 52.

In an exemplary implementation mode, the second connection block 32 may be disposed on the third side surface of the second base substrate 10 and located at an edge of the second base substrate 20, and the second connection block 32 is configured to be fixedly connected with the first connection block 31 on the first substrate by means of bonding to form a ring-shaped sealing structure, so that the first base substrate, the second base substrate, and the ring-shaped sealing structure enclose a gas-sealed and/or acoustic-sealed first space.

In an exemplary implementation mode, on a plane parallel to the second base substrate, a shape of the second connection block 32 may be a ring shape extending along the edge of the second base substrate 20, the shape and a geometric parameter of the second connection block 32 may be substantially the same as a shape of the first connection block 31, and a cross-sectional shape of the second connection block 32 may be a rectangular shape or a trapezoidal shape on a plane perpendicular to the second base substrate.

In an exemplary implementation mode, the fourth connection block 34 may be disposed on the third side surface of the second base substrate 10 and connected with one end of the electrode conductive pillar 44 located on the third side surface (one end close to the first substrate), and the fourth connection block 34 is configured to be fixedly connected with the third connection block 33 on the first substrate by means of bonding to achieve a connection between the first electrode 11 of the film bulk acoustic resonator and the first terminal 71 of the hybrid filter.

In an exemplary implementation mode, on a plane parallel to the second base substrate, a shape of the fourth connection block 34 and a shape and a geometric parameter of the third connection block 33 may be substantially the same, and a cross-sectional shape of the fourth connection block 34 may be a rectangular shape or a trapezoidal shape on a plane perpendicular to the second base substrate.

In an exemplary implementation mode, the sixth connection block 36 may be disposed on the third side surface of the second base substrate 10 and connected with one end of the first conductive pillar 41 located on the third side surface, and the sixth connection block 36 is configured to be fixedly connected with the fifth connection block 35 on the first substrate by means of bonding to achieve a connection between the second electrode 12 of the film bulk acoustic resonator and the filtering inductor of the hybrid filter.

In an exemplary implementation mode, on a plane parallel to the second base substrate, a shape of the sixth connection block 36 and a shape and a geometric parameter of the fifth connection block 35 may be substantially the same, and a cross-sectional shape of the sixth connection block 36 may be a rectangular shape or a trapezoidal shape on a plane perpendicular to the second base substrate.

In an exemplary implementation mode, the second connection line 52 may be disposed on the third side surface of the second base substrate 10 and connected with one end of the second conductive pillar 42 located on the third side surface and one end of the third conductive pillar 43 on the third side surface, respectively, and the second connection line 52 is configured as the other connection line of the filtering inductor.

In an exemplary implementation mode, the first conductive pillar 41, the first connection line 51, the second conductive pillar 42, the second connection line 52, the third conductive pillar 43, which are connected in sequence, may constitute a filtering inductor with a three-dimensional spiral inductor structure, the first conductive pillar 41 may serve as a first end of the filtering inductor, the third conductive pillar 43 may serve as a second end of the filtering inductor, the first end of the filtering inductor is connected with the second electrode 12 of the film bulk acoustic resonator, and the second end of the filtering inductor is connected with the first electrode plate 61 of the filtering capacitor.

The filtering inductor with the three-dimensional spiral inductor structure is adopted for the hybrid filter of the present disclosure, compared with a conventional planar spiral inductor, it has a higher Q value, which is about 1.5 times to 2 times thereof. In addition, through a combination of the filtering inductor and the filtering capacitor, performance of out-of-band suppression of the hybrid filter may be further improved.

In an exemplary implementation mode, a material of the second bonding layer may be a composite layer of Titanium (Ti) and Aurum (Au), or may be a composite layer of Chromium (Cr) and Aurum (Au), and may be deposited by means of physical vapor deposition.

In an exemplary implementation mode, a thickness of an aurum layer in the second bonding layer may be about 0.02 μm to 0.05 μm and a thickness of a titanium layer or a chromium layer in the second bonding layer may be about 0.2 μm to 2.0 μm.

In an exemplary implementation mode, a Lift-Off process may also be adopted for forming the pattern of the second bonding layer.

In an exemplary implementation mode, after forming the pattern of the second bonding layer, surfaces of the second connection block 32, the fourth connection block 34, the sixth connection block 36, and the second connection line 52 on a side away from the second base substrate may be polished by means of chemical mechanical polishing, so that the surfaces of the second connection block 32, the fourth connection block 34, the sixth connection block 36, and the second connection line 52 are flush, and a surface roughness of the surfaces of the second connection block 32, the fourth connection block 34, the sixth connection block 36, and the second connection line 52 on a side away from the second base substrate may be less than or equal to 1 nm.

The third section: a bonding processing.

In an exemplary implementation mode, the bonding processing may include following operations: aligning and attaching the prepared first substrate 100 and the second substrate 200 together, and bonding the first connection block 31 and the second connection block 32, the third connection block 33 and the fourth connection block 34, the fifth connection block 35 and the sixth connection block 36 by means of metal-to-metal diffusion bonding to form an electrical connection structure of the first substrate 100 and the second substrate 200, as shown in FIG. 1.

In an exemplary implementation mode, a manner of metal-to-metal diffusion bonding may be a manner of aurum-to-aurum bonding.

In an exemplary implementation mode, a ring-shaped first connection block 31 and a ring-shaped second connection block 32 are fixedly connected together by means of bonding to form a ring-shaped sealing structure between the first base substrate 10 and the second base substrate 20, so that the first base substrate, the second base substrate, and the ring-shaped sealing structure enclose a gas-sealed and/or acoustic-sealed sealed space, the film bulk acoustic resonator is located in the sealed space, and the sealed space may protect the film bulk acoustic resonator from external environment and external interference.

In an exemplary implementation mode, the third connection block 33 and the fourth connection block 34 are fixedly connected together by means of bonding, so as to achieve a connection between the film bulk acoustic resonator and the first terminal 71 of the hybrid filter. Since the third connection block 33 is connected with the first electrode 11 of the film bulk acoustic resonator, and the fourth connection block 34 is connected with the first terminal 71 through the electrode conductive pillar 44, thus a connection between the first electrode 11 of the film bulk acoustic resonator and the first terminal 71 of the hybrid filter is achieved, and an external apparatus may input a voltage signal to the first electrode 11 of the film bulk acoustic resonator through the first terminal 71.

In an exemplary implementation mode, the fifth connection block 35 and the sixth connection block 36 are fixedly connected together by means of bonding to achieve a connection between the film bulk acoustic resonator and the filtering inductor. Since the fifth connection block 35 is connected with the second electrode 12 of the film bulk acoustic resonator and the sixth connection block 36 is connected with the first end of the filtering inductor, thus a connection between the second electrode 12 of the film bulk acoustic resonator and the first end of the filtering inductor is achieved.

In an exemplary implementation mode, during a bonding processing, a bonding pressure may be about 40 kN to 100 kN, and a bonding temperature may be about 350° C. to 450° C.

Thus, preparation of the hybrid filter according to the exemplary embodiment of the present disclosure is completed, the hybrid filter is a FBAR-LC hybrid filter, which is based on a FBAR and connected with an LC filter in series.

Figure 16:
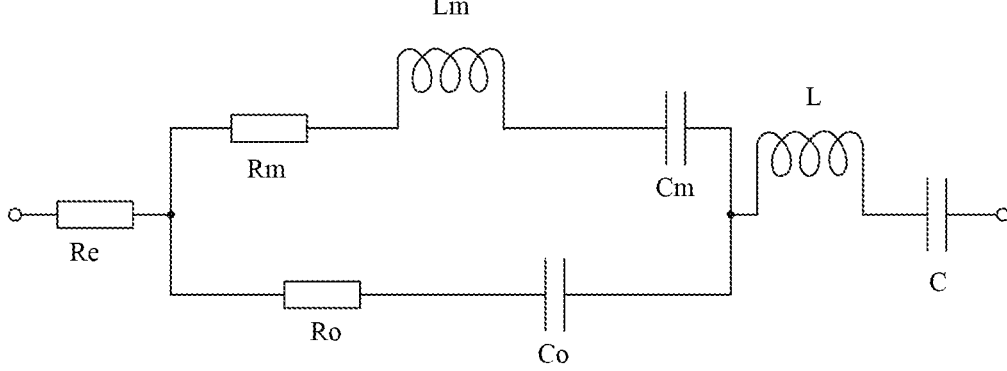
FIG. 16 is an equivalent circuit diagram of a hybrid filter according to an exemplary embodiment of the present disclosure.

FIG. 16 is an equivalent circuit diagram of a hybrid filter according to an exemplary embodiment of the present disclosure, and a Modified Butterworth-Van Dyke (MBVD) model may be adopted for an equivalent circuit diagram of a film bulk acoustic resonator. As shown in FIG. 16, a static capacitor Co, a dynamic capacitor Cm, a dynamic inductor Lm, a dielectric loss resistor Ro, a mechanical loss resistor Rm, and an electrode loss resistor Re constitute a film bulk acoustic resonator, a filtering inductor L and a filtering capacitor C constitute a passive filter (LC filter), and the film bulk acoustic resonator and the passive filter are connected in series between an input end and an output end.

As may be seen from a structure and a preparation process of the hybrid filter according to an exemplary embodiment of the present disclosure, in the present disclosure, by integrating an acoustic film bulk acoustic resonator and a non-acoustic passive filter on one chip, an integrated hybrid filter chip has a high integration level, which may not only improve a bandwidth and a roll-off coefficient of the hybrid filter, but also minimize a size of the filter, reduce a transmission loss, reduce a parasitic effect, and improve filtering performance to a maximum extent. In the present disclosure, by using a filtering inductor with a three-dimensional spiral inductor structure, a quality factor value (Q value) may be increased by 1.5 times to 2 times compared with a planar spiral inductor and performance of out-of-band suppression and the like of the hybrid filter may be further improved. In the present disclosure, by using a glass substrate, not only a Q value of a filter is improved, an insertion loss is reduced, and a problem of a relatively large parasitic effect existing in a silicon base substrate is avoided, but also a production cost is reduced. A preparation process according to the present disclosure may be achieved using an existing mature preparation device, has little improvement on an existing process, may be well compatible with an existing preparation process, be simple to implement, be easy to practice, and has a high production efficiency, a low production cost, and a high yield.

Figure 17:
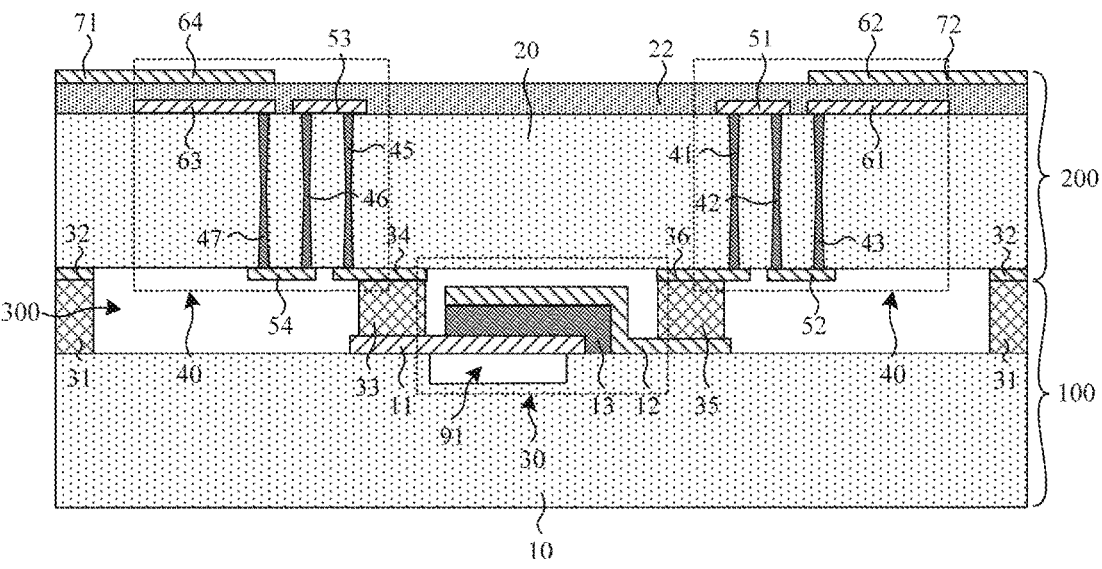
FIG. 17 is a schematic diagram of a structure of another hybrid filter according to an exemplary embodiment of the present disclosure.

FIG. 17 is a schematic diagram of a structure of a hybrid filter according to an exemplary embodiment of the present disclosure, which is a double capacitor inductor structure. As shown in FIG. 17, a main body structure of the hybrid filter may include a first substrate 100 and a second substrate 200 disposed oppositely, and the first substrate 100 and the second substrate 200 are fixedly connected together to form a first space 300. A film bulk acoustic resonator 30 is disposed on the first substrate 100, and two passive filters 40 are disposed on the second substrate 200. The film bulk acoustic resonator 30 is located in the first space 300, the two passive filters 40 are respectively located on both sides of the film bulk acoustic resonator 30, and the film bulk acoustic resonator 30 is connected with the two passive filters 40, respectively.

In an exemplary implementation mode, structures of the film bulk acoustic resonator 30, a first connection block 31, a third connection block 33, and a fifth connection block 35 on a first base substrate 10 may be substantially the same as those of the foregoing embodiment, and structures of a second connection block 32, a fourth connection block 34, and a sixth connection block 36 on a second base substrate 20 may be substantially the same as those of the foregoing embodiment.

In an exemplary implementation mode, a first conductive pillar 41, a second conductive pillar 42, a third conductive pillar 43, a first connection line 51, and a second connection line 52 disposed on the second substrate 200 constitute a first filtering inductor, a first electrode plate 61 and a second electrode plate 62 constitute a first filtering capacitor, a second electrode 12 of the film bulk acoustic resonator 30 is connected with the first conductive pillar 41 through the fifth connection block 35 and the sixth connection block 36, the third conductive pillar 43 is connected with the first electrode plate 61, and the second electrode plate 62 and the second terminal 72 are of an integral structure connected with each other.

In an exemplary implementation mode, a fifth conductive pillar 45, a sixth conductive pillar 46, a seventh conductive pillar 47, a third connection line 53, and a fourth connection line 54 disposed on the second substrate 200 constitute a second filtering inductor, and the third connection line 53 is connected with the fifth conductive pillar 45 and the sixth conductive pillar 46, respectively, the fourth connection line 54 is connected with the sixth conductive pillar 46 and the seventh conductive pillar 47, respectively. A third electrode plate 63 and a fourth electrode plate 64 constitute a second filtering capacitor, and an orthographic projection of the third electrode plate 63 on the second base substrate is at least partially overlapped with an orthographic projection of the fourth electrode plate 64 on the second base substrate. A first electrode 11 of the film bulk acoustic resonator 30 is connected with the fifth conductive pillar 45 through the third connection block 33 and the fourth connection block 34, the seventh conductive pillar 47 is connected with the third electrode plate 63, and the fourth electrode plate 64 and the first terminal 71 are of an integral structure connected with each other.

In an exemplary implementation mode, the first connection line 51, the third connection line 53, the first electrode plate 61, and the third electrode plate 63 may be disposed in a same layer and formed synchronously through a same patterning process.

In an exemplary implementation mode, the second connection block 32, the fourth connection block 34, the sixth connection block 36, the second connection line 52, and the fourth connection line 54 may be disposed in a same layer and formed synchronously through a same patterning process.

In an exemplary implementation mode, the second electrode plate 62, the fourth electrode plate 64, the first terminal 71, and the second terminal 72 may be disposed in a same layer and formed synchronously through a same patterning process.

In an exemplary implementation mode, a preparation process of the hybrid filter of the exemplary embodiment is substantially the same as that of the foregoing embodiment, except that the second base substrate may include the first conductive pillar 41, the second conductive pillar 42, the third conductive pillar 43, the fifth conductive pillar 45, the sixth conductive pillar 46, and the seventh conductive pillar 47, a pattern of a third conductive layer may include the first connection line 51, the third connection line 53, the first electrode plate 61, and the third electrode plate 63, the dielectric layer 22 completely covers the pattern of the third conductive layer, a pattern of a fourth conductive layer may include the second electrode plate 62, the fourth electrode plate 64, the first terminal 71, and the second terminal 72, and a second bonding layer may include the second connection block 32, the fourth connection block 34, the sixth connection block 36, the second connection line 52, and the fourth connection line 54.

In an exemplary implementation mode, a quantity of conductive pillars and connection lines included in the first filtering inductor and the second filtering inductor may be set according to a parameter such as an inductance amount.

In an exemplary implementation mode, n+m through holes penetrating through the second base substrate 20 in a thickness direction may be disposed on the second base substrate 20, n+m conductive pillars are respectively disposed in the n+m through holes, n conductive pillars located on one side of the film bulk acoustic resonator 30 may be regularly arranged along a predefined direction, and m conductive pillars located on the other side of the film bulk acoustic resonator 30 may be regularly arranged along a predefined direction. A side of the second base substrate 20 away from the first substrate 100 may be provided with (n−1)/2 first connection lines 51 and (m−1)/2 third connection lines 53, and n conductive pillars, (n−1)/2 first connection lines 51, and (n−1)/2 second connection lines 52 may be disposed on one side of the film bulk acoustic resonator 30. A side of the second base substrate 20 close to the first substrate 100 may be provided with (n−1)/2 second connection lines 52 and (m−1)/2 fourth connection lines 54, and m conductive pillars, (m−1)/2 third connection lines 53, and (m−1)/2 fourth connection lines 54 may be disposed on the other side of the film bulk acoustic resonator 30. A plurality of first connection lines 51 may be respectively connected with an i-th conductive pillar and an (i+1)-th conductive pillar among the n conductive pillars, and a plurality of second connection lines 52 may be respectively connected with the (i+1)-th conductive pillar and an (i+2)-th conductive pillar among the n conductive pillars. The n conductive pillars, (n−1)/2 first connection lines 51, and (n−1)/2 second connection lines 52 constitute a first filtering inductor with a three-dimensional spiral inductor structure. A plurality of third connection lines 53 are respectively connected with a j-th conductive pillar and a (j+1)-th conductive pillar among the m conductive pillars, and a plurality of fourth connection lines are respectively connected with the (j+1)-th conductive pillar and a (j+2)-th conductive pillar among the m conductive pillars. The m conductive pillars, (m−1)/2 third connection lines 53, and (m−1)/2 fourth connection lines 54 constitute a second filtering inductor with a three-dimensional spiral inductor structure. n is an odd number greater than 1, m is an odd number greater than 1, i is a positive integer greater than or equal to 1 and less than or equal to n−2, and j is a positive integer greater than or equal to 1 and less than or equal to m−2.

In an exemplary implementation mode, a first conductive pillar among the n conductive pillars is connected with the second electrode 12 of the film bulk acoustic resonator 30, an n-th conductive pillar among the n conductive pillars is connected with the first filtering capacitor, a first conductive pillar among the m conductive pillars is connected with the first electrode 11 of the film bulk acoustic resonator 30, and an m-th conductive pillar among the m conductive pillars is connected with the second filtering capacitor.

The hybrid filter according to the present exemplary embodiment not only has advantages of reducing a size of a filter, reducing a transmission loss, and reducing a parasitic effect, etc., but also may optimize out-of-band suppression and roll-off performance of the hybrid filter by adding a capacitor-inductor structure.

In an exemplary implementation mode, a multiple capacitor inductor structure may be adopted for the hybrid filter, which is not limited in the present disclosure.

Figure 18:
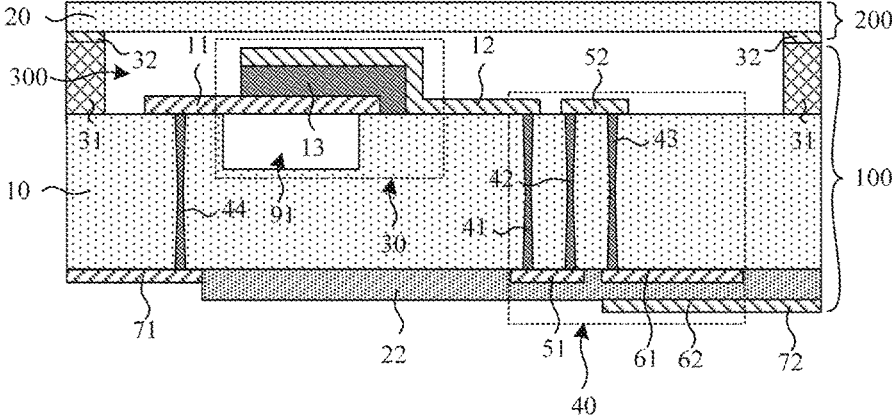
FIG. 18 is a schematic diagram of a structure of yet another hybrid filter according to an exemplary embodiment of the present disclosure.

FIG. 18 is a schematic diagram of a structure of yet another hybrid filter according to an exemplary embodiment of the present disclosure. As shown in FIG. 18, a main body structure of the hybrid filter may include a first substrate 100 and a second substrate 200 disposed oppositely, and the first substrate 100 and the second substrate 200 are fixedly connected together to form a first space 300. A film bulk acoustic resonator 30 and at least one passive filter 40 are disposed on the first substrate 100. The film bulk acoustic resonator 30 is located in the first space 300 and is connected with the passive filter 40.

In an exemplary implementation mode, structures of the film bulk acoustic resonator 30 and a first connection block 31 on a first base substrate 10 may be substantially the same as those of the aforementioned embodiments, and a structure of a second connection block 32 on a second base substrate 20 may be substantially the same as those of the aforementioned embodiments.

In an exemplary implementation mode, a first conductive pillar 41, a second conductive pillar 42, a third conductive pillar 43, a first connection line 51, and a second connection line 52 disposed on the first substrate 100 constitute a filtering inductor, the first connection line 51 is connected with the first conductive pillar 41 and the second conductive pillar 42, respectively, and the second connection line 52 is connected with the second conductive pillar 42 and the third conductive pillar 43, respectively, to form a structure in which the first conductive pillar 41, the first connection line 51, the second conductive pillar 42, the second connection line 52, and the third conductive pillar 43 are sequentially connected.

In an exemplary implementation mode, a first electrode plate 61 and a second electrode plate 62 disposed on the first substrate 100 constitute a filtering capacitor, and an orthographic projection of the first electrode plate 61 on the first base substrate is at least partially overlapped with an orthographic projection of the second electrode plate 62 on the first base substrate.

In an exemplary implementation mode, one end of an electrode conductive pillar 44 disposed on the first substrate 100 is connected with a first electrode 11 of the film bulk acoustic resonator 30, the other end of the electrode conductive pillar 44 is connected with a first terminal 71, a second electrode 12 of the film bulk acoustic resonator 30 is directly connected with the first conductive pillar 41, the third conductive pillar 43 is connected with the first electrode plate 61, and the second electrode plate 62 and a second terminal 72 are of an integral structure connected with each other.

In an exemplary implementation mode, the first connection line 51, the first electrode plate 61, and the first terminal 71 may be disposed in a same layer and formed synchronously through a same patterning process.

In an exemplary implementation mode, the second electrode 12 and the second connection line 52 may be disposed in a same layer and formed synchronously through a same patterning process.

In an exemplary implementation mode, a quantity of conductive pillars and connection lines included in the filtering inductor may be set according to a parameter such as an inductance amount.

In an exemplary implementation mode, n through holes penetrating through the first base substrate 10 in a thickness direction may be disposed on the first base substrate 10, n conductive pillars are respectively disposed in the n through holes, and the n conductive pillars may be regularly arranged along a predefined direction. A side of the first base substrate 10 away from the second substrate 200 may be provided with (n−1)/2 first connection lines 51, a side of the first base substrate 10 close to the second substrate 200 may be provided with (n−1)/2 second connection lines 52, a plurality of first connection lines 51 may respectively connect an i-th conductive pillar and an (i+1)-th conductive pillar among the n conductive pillars, a plurality of second connection lines 52 may respectively connect the (i+1)-th conductive pillar and an (i+2)-th conductive pillar among the n conductive pillars, the n conductive pillars, (n−1)/2 first connection lines 51, and (n−1)/2 second connection lines 52 constitute a filtering inductor with a three-dimensional spiral inductor structure, wherein n is an odd number greater than 1, and i is a positive integer greater than or equal to 1 and less than or equal to n−2.

In an exemplary implementation mode, a first conductive pillar among the n conductive pillars may be directly connected with the second electrode 12 of the film bulk acoustic resonator, and an n-th conductive pillar among the n conductive pillars may be connected with the first electrode plate 61 of the filtering capacitor.

In an exemplary implementation mode, there may be a plurality of passive filters on the first substrate, which is not limited in the present disclosure.

The hybrid filter according to the present exemplary embodiment not only has advantages of reducing a size of a filter, reducing a transmission loss, and reducing a parasitic effect, etc., but also may effectively reduce a height of the hybrid filter and further improve an integration level by disposing both the film bulk acoustic resonator and the passive filter on the first substrate and using the second substrate only as a sealing structure.

In an exemplary implementation mode, the film bulk acoustic resonator and the passive filter may both be disposed on the second substrate, the first substrate only serves as a sealing structure, and there may be a plurality of passive filters, which is not limited in the present disclosure.

Figure 19:
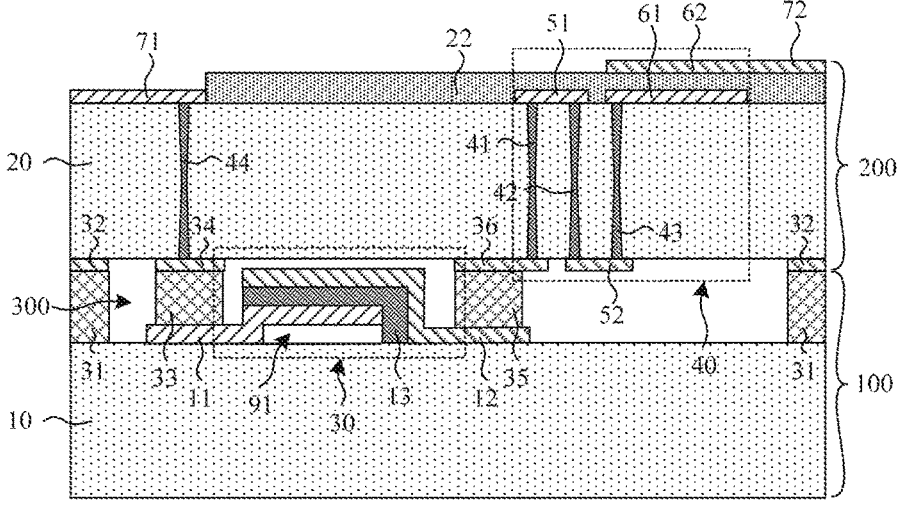
FIG. 19 is a schematic diagram of a structure of yet another hybrid filter according to an exemplary embodiment of the present disclosure.

FIG. 19 is a schematic diagram of a structure of yet another hybrid filter according to an exemplary embodiment of the present disclosure. As shown in FIG. 19, a main body structure of the hybrid filter according to the present exemplary embodiment is substantially the same as that of the hybrid filter shown in FIG. 1, except that a cavity 91 is disposed between a first side surface of a first base substrate 10, a first electrode 11, and a piezoelectric layer 13.

In an exemplary implementation mode, a film bulk acoustic resonator 30 may be disposed on the first side surface of the first base substrate 10, and may at least include the first electrode 11 disposed on the first base substrate 10, the piezoelectric layer 13 disposed on a side of the first electrode 11 away from the first base substrate, a second electrode 12 disposed on a side of the piezoelectric layer 13 away from the first base substrate, and a space enclosed by the first side surface of the first base substrate 10, the first electrode 11, and the piezoelectric layer 13 is used as the cavity 91, thus forming an upward-convex-typed cavity.

In an exemplary implementation mode, a preparation process of the hybrid filter of the exemplary embodiment is substantially the same as that of the foregoing embodiments, except that a sacrificial layer is directly formed on the first base substrate using a patterning process, and after preparation of the first electrode, the piezoelectric layer, and the second electrode is completed, the sacrificial layer is released to form the cavity.

The hybrid filter according to the present exemplary embodiment not only has advantages of reducing a size of a filter, reducing a transmission loss, and reducing a parasitic effect, etc., but also simplifies a process by forming the upward-convex-typed cavity. An upward-convex-typed cavity structure may not only reduce a process of opening a groove on the first base substrate, but also simplify a process and improve process quality since a polishing process for the sacrificial layer only involves a single material.

Figure 20:
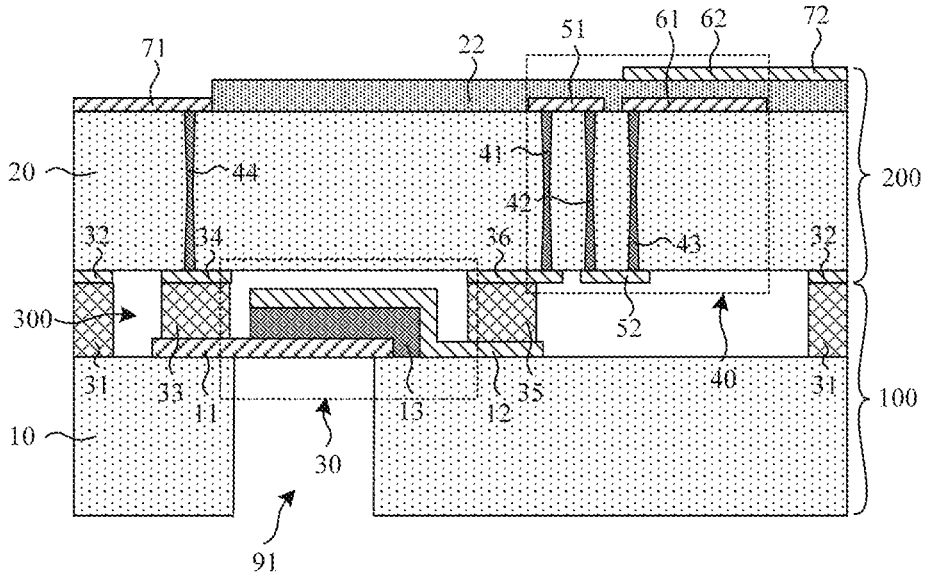
FIG. 20 is a schematic diagram of a structure of yet another hybrid filter according to an exemplary embodiment of the present disclosure.

FIG. 20 is a schematic diagram of a structure of yet another hybrid filter according to an exemplary embodiment of the present disclosure. As shown in FIG. 20, a main body structure of the hybrid filter of the present exemplary embodiment is substantially the same as that of the hybrid filter shown in FIG. 1, except that a cavity 91 is a through slot disposed on a first base substrate 10.

In an exemplary implementation mode, a film bulk acoustic resonator 30 may be disposed on a first side surface of the first base substrate 10, and may at least include a first electrode 11 disposed on the first base substrate 10, a piezoelectric layer 13 disposed on a side of a first electrode 11 away from the first base substrate, and a second electrode 12 disposed on a side of a piezoelectric layer 13 away from the first base substrate. The first base substrate 10 is provided with a through slot that penetrates through the first base substrate 10 in a thickness direction, and the through slot serves as the cavity 91.

In an exemplary implementation mode, a preparation process of the hybrid filter of the exemplary embodiment is substantially the same as that of the foregoing embodiments, except that after the first electrode, the piezoelectric layer, and the second electrode are directly prepared on the first side surface of the first base substrate using a patterning process, the through slot as the cavity is formed on a second side surface of the first base substrate through a patterning process to form a cavity in type of etched-dorsal cavity.

The hybrid filter according to the exemplary embodiment not only has advantages of reducing a size of a filter, reducing a transmission loss, and reducing a parasitic effect, etc., but also simplifies a process through a cavity structure in type of etched-dorsal cavity. The cavity structure in type of etched-dorsal cavity may not only reduce a process of forming a sacrificial layer, but also reduce a process of releasing the sacrificial layer, the process is relatively easy, and production time is shortened.

Structures and preparation processes of hybrid filters according to exemplary embodiments of the present disclosure are merely illustrative. In an exemplary implementation mode, corresponding structures may be changed and patterning processes may be added or reduced according to actual needs, the present disclosure is not limited thereto.

An exemplary embodiment of the present disclosure also provides a preparation method of a hybrid filter to prepare the hybrid filter of the foregoing embodiments. In an exemplary implementation mode, the preparation method of the hybrid filter may include: preparing a first substrate and a second substrate, respectively, wherein at least one of the first substrate and the second substrate is provided with a film bulk acoustic resonator, at least one of the first substrate and the second substrate is provided with at least one passive filter, the passive filter includes a filtering inductor and a filtering capacitor, the filtering inductor is of a three-dimensional spiral inductor structure; and forming a first space between the first substrate and the second substrate which are disposed oppositely, wherein the film bulk acoustic resonator is disposed in the first space and connected with the passive filter.

The present disclosure also provides a filtering apparatus, which includes the hybrid filter of the aforementioned embodiments. The filtering apparatus may be used for a radio frequency front-end apparatus in a wireless communication apparatus, such as a radio frequency filter.

Although implementation modes of the present disclosure are disclosed above, described contents are only implementation modes adopted to easily understand the present disclosure and not intended to limit the present disclosure. Any person skilled in the art may make any modification and change in a form and details of implementation without departing from the spirit and scope of the present disclosure. However, the scope of patent protection of the present disclosure should still be subject to the scope defined in the attached claims.

The invention claimed is:

1. A hybrid filter, comprising a first substrate and a second substrate disposed oppositely, wherein a first space is disposed between the first substrate and the second substrate, at least one of the first substrate and the second substrate is provided with a film bulk acoustic resonator, at least one of the first substrate and the second substrate is provided with at least one passive filter, the film bulk acoustic resonator is disposed in the first space and connected with the at least one passive filter, the at least one passive filter comprises a filtering inductor and a filtering capacitor, and the filtering inductor has a three-dimensional spiral inductor structure, wherein n conductive pillars penetrating through a first base substrate of the first substrate in a thickness direction are disposed on the first base substrate, (n–1)/2 first connection lines are disposed on a side of the first base substrate away from the second substrate, (n–1)/2 second connection lines are disposed on a side of the first base substrate close to the second substrate, the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, a first conductive pillar among the n conductive pillars is connected with a second electrode of the film bulk acoustic resonator, an n-th conductive pillar among the n conductive pillars is connected with the filtering capacitor, the n conductive pillars, the (n–1)/2 first connection lines, and the (n–1)/2 second connection lines constitute the filtering inductor with the three-dimensional spiral inductor structure, wherein n is an odd number greater than 1 and i is a positive integer greater than or equal to 1 and less than or equal to n–2.

2. The hybrid filter according to claim 1, wherein the first substrate at least comprises the first base substrate and a first connection block disposed on a side of the first base substrate close to the second substrate, the second substrate at least comprises a second base substrate and a second connection block disposed on a side of the second base substrate close to the first substrate, the first connection block and the second connection block are connected by means of bonding, the first space accommodating the film bulk acoustic resonator is formed between the first base substrate and the second base substrate, and materials of the first base substrate and the second base substrate comprise glass.

3. The hybrid filter according to claim 2, wherein the first connection block and the second connection block connected by means of bonding form a ring-shaped sealing structure on a plane parallel to the hybrid filter, and the first space is a gas-sealed and/or acoustic-sealed sealed space enclosed by the first base substrate, the second base substrate, and the ring-shaped sealing structure.

4. The hybrid filter according to claim 1, wherein the film bulk acoustic resonator at least comprises a cavity, a first electrode disposed on the first base substrate, a piezoelectric layer disposed on a side of the first electrode away from the first base substrate, and a second electrode disposed on a side of the piezoelectric layer away from the first base substrate; the cavity is a groove disposed on a side of the first base substrate close to the second substrate, or the cavity is a through slot disposed on the first base substrate, or the cavity is a space enclosed by a surface of the first base substrate on a side close to the second substrate, the first electrode, and the piezoelectric layer.

5. The hybrid filter according to claim 1, wherein the filtering capacitor comprises a first electrode plate, a second electrode plate, and a dielectric layer disposed between the first electrode plate and the second electrode plate, wherein the first electrode plate is disposed on a side of the first base substrate away from the second substrate and connected with the n-th conductive pillar among the n conductive pillars, the dielectric layer is disposed on a side of the first electrode plate away from the first base substrate, the second electrode plate is disposed on a side of the dielectric layer away from the first base substrate, and an orthographic projection of the first electrode plate on the first base substrate is at least partially overlapped with an orthographic projection of the second electrode plate on the first base substrate.

6. The hybrid filter according to claim 5, wherein the hybrid filter further comprises a first terminal and a second terminal, the first terminal is disposed on a side of the first base substrate away from the second substrate and connected with a first electrode of the film bulk acoustic resonator, and the second terminal is disposed on a side of the dielectric layer away from the first base substrate and connected with the second electrode plate.

7. The hybrid filter according to claim 6, wherein an electrode conductive pillar penetrating through the first base substrate in a thickness direction is disposed on the first base substrate, and the first electrode of the film bulk acoustic resonator is connected with the first terminal through the electrode conductive pillar.

8. The hybrid filter according to claim 1, wherein a first passive filter of the at least one passive filter is disposed on the second substrate, or a first passive filter and a second passive filter of the at least one passive filter are disposed on the second substrate, the first passive filter and the second passive filter are disposed on both sides of the film bulk acoustic resonator, the first passive filter comprises a first filtering inductor and a first filtering capacitor connected with each other, and the second passive filter comprises a second filtering inductor and a second filtering capacitor connected with each other.

9. A hybrid filter, comprising a first substrate and a second substrate disposed oppositely, wherein a first space is disposed between the first substrate and the second substrate, at least one of the first substrate and the second substrate is provided with a film bulk acoustic resonator, at least one of the first substrate and the second substrate is provided with at least one passive filter, the film bulk acoustic resonator is disposed in the first space and connected with the at least one passive filter, the at least one passive filter comprises a filtering inductor and a filtering capacitor, and the filtering inductor has a three-dimensional spiral inductor structure, wherein a first passive filter of the at least one passive filter is disposed on the second substrate, or a first passive filter and a second passive filter of the at least one passive filter are disposed on the second substrate, the first passive filter and the second passive filter are disposed on both sides of the film bulk acoustic resonator, the first passive filter comprises a first filtering inductor and a first filtering capacitor connected with each other, and the second passive filter comprises a second filtering inductor and a second filtering capacitor connected with each other, wherein n conductive pillars penetrating through a second base substrate of the second substrate in a thickness direction are disposed on the second base substrate, $(n-1)/2$ first connection lines are disposed on a side of the second base substrate away from the first substrate, $(n-1)/2$ second connection lines are disposed on a side of the second base substrate close to the first substrate, the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, a first conductive pillar among the n conductive pillars is connected with a second electrode of the film bulk acoustic resonator, an n-th conductive pillar among the n conductive pillars is connected with the first filtering capacitor, the n conductive pillars, the $(n-1)/2$ first connection lines, and the $(n-1)/2$ second connection lines constitute the first filtering inductor with a three-dimensional spiral inductor structure, wherein n is an odd number greater than 1 and i is a positive integer greater than or equal to 1 and less than or equal to $n-2$.

10. The hybrid filter according to claim 9, wherein the first filtering capacitor comprises a first electrode plate, a second electrode plate, and a dielectric layer disposed between the first electrode plate and the second electrode plate, and the first electrode plate is disposed on a side of the second base substrate away from the first substrate and connected with the n-th conductive pillar, the dielectric layer is disposed on a side of the first electrode plate away from the second base substrate, the second electrode plate is disposed on a side of the dielectric layer away from the second base substrate, and an orthographic projection of the first electrode plate on the second base substrate is at least partially overlapped with an orthographic projection of the second electrode plate on the second base substrate.

11. The hybrid filter according to claim 10, wherein the hybrid filter further comprises a first terminal and a second terminal, the first terminal is disposed on a side of the second base substrate away from the first substrate and connected with a first electrode of the film bulk acoustic resonator, and the second terminal is disposed on a side of the dielectric layer away from the second base substrate and connected with the second electrode plate.

12. The hybrid filter according to claim 11, wherein the first substrate further comprises a third connection block, the second substrate further comprises a fourth connection block and an electrode conductive pillar, and the third connection block is disposed on a side of the first electrode of the film bulk acoustic resonator close to the second substrate, the fourth connection block is disposed on a side of the second base substrate close to the first substrate, an end of the electrode conductive pillar away from the first substrate is connected with the first terminal, an end of the electrode conductive pillar close to the first substrate is connected with the fourth connection block, the third connection block is connected with the fourth connection block by means of bonding, to enable the first electrode of the film bulk acoustic resonator to be connected with the first terminal through the third connection block, the fourth connection block, and the electrode conductive pillar.

13. The hybrid filter according to claim 11, wherein the first substrate further comprises a fifth connection block, the second substrate further comprises a sixth connection block, the fifth connection block is disposed on a side of a second electrode of the film bulk acoustic resonator close to the second substrate, the sixth connection block is disposed on a side of the second base substrate close to the first substrate and connected with the first conductive pillar among the n conductive pillars, the fifth connection block and the sixth connection block are connected by means of bonding, to enable the second electrode of the film bulk acoustic resonator to be connected with the first filtering inductor through the fifth connection block and the sixth connection block.

14. A hybrid filter, comprising a first substrate and a second substrate disposed oppositely, wherein a first space is disposed between the first substrate and the second substrate, at least one of the first substrate and the second substrate is provided with a film bulk acoustic resonator, at least one of the first substrate and the second substrate is provided with at least one passive filter, the film bulk acoustic resonator is disposed in the first space and connected with the at least one passive filter, the at least one passive filter comprises a filtering inductor and a filtering capacitor, and the filtering inductor has a three-dimensional spiral inductor structure, wherein a first passive filter of the at least one passive filter is disposed on the second substrate, or a first passive filter and a second passive filter of the at least one passive filter are disposed on the second substrate, the first passive filter and the second passive filter are disposed on both sides of the film bulk acoustic resonator, the first passive filter comprises a first filtering inductor and a first filtering capacitor connected with each other, and the second passive filter comprises a second filtering inductor and a second filtering capacitor connected with each other, wherein n+m conductive pillars penetrating through a second base substrate of the second substrate in a thickness direction are disposed on the second base substrate, (n−1)/2 first connection lines and (m−1)/2 third connection lines are disposed on a side of the second base substrate away from the first substrate, (n−1)/2 second connection lines and (m−1)/2 fourth connection lines are disposed on a side of the second base substrate close to the first substrate, n conductive pillars, the (n−1)/2 first connection lines, and the (n−1)/2 second connection lines are disposed on one side of the film bulk acoustic resonator, and m conductive pillars, the (m−1)/2 third connection lines, and the (m−1)/2 fourth connection lines are disposed on the other side of the film bulk acoustic resonator; the first connection lines are respectively connected with an i-th conductive pillar and an (i+1)-th conductive pillar among the n conductive pillars, the second connection lines are respectively connected with the (i+1)-th conductive pillar and an (i+2)-th conductive pillar among the n conductive pillars, the third connection lines are respectively connected with a j-th conductive pillar and a (j+1)-th conductive pillar among the m conductive pillars, the fourth connection lines are respectively connected with the (j+1)-th conductive pillar and a (j+2)-th conductive pillar among the m conductive pillars, a first conductive pillar among the n conductive pillars is connected with a second electrode of the film bulk acoustic resonator, an n-th conductive pillar among the n conductive pillars is connected with the first filtering capacitor, a first conductive pillar among the m conductive pillars is connected with a first electrode of the film bulk acoustic resonator, and an m-th conductive pillar among the m conductive pillars is connected with the second filtering capacitor; the n conductive pillars, the (n−1)/2 first connection lines, and the (n−1)/2 second connection lines constitute the first filtering inductor with a three-dimensional spiral inductor structure, the m conductive pillars, the (m−1)/2 third connection lines, and the (m−1)/2 fourth connection lines constitute the second filtering inductor with a three-dimensional spiral inductor structure, wherein n is an odd number greater than 1, m is an odd number greater than 1, i is a positive integer greater than or equal to 1 and less than or equal to n−2, and j is a positive integer greater than or equal to 1 and less than or equal to m−2.

15. The hybrid filter according to claim 14, wherein the first filtering capacitor comprises a first electrode plate, a second electrode plate, and a dielectric layer disposed between the first electrode plate and the second electrode plate, the second filtering capacitor comprises a third electrode plate, a fourth electrode plate, and a dielectric layer disposed between the third electrode plate and the fourth electrode plate; the first electrode plate and the third electrode plate are disposed on a side of the second base substrate away from the first substrate, the first electrode plate is connected with the n-th conductive pillar among the n conductive pillars, and the third electrode plate is connected with the m-th conductive pillar among the m conductive pillars; the dielectric layer is disposed on a side of the first electrode plate and the third electrode plate away from the second base substrate, the second electrode plate and the fourth electrode plate are disposed on a side of the dielectric layer away from the second base substrate, an orthographic projection of the first electrode plate on the second base substrate is at least partially overlapped with an orthographic projection of the second electrode plate on the second base substrate, and an orthographic projection of the third electrode plate on the second base substrate is at least partially overlapped with an orthographic projection of the fourth electrode plate on the second base substrate.

16. The hybrid filter according to claim 15, wherein the hybrid filter further comprises a first terminal and a second terminal, and the first terminal and the second terminal are disposed on a side of the dielectric layer away from the second base substrate, the first terminal is connected with the fourth electrode plate, and the second terminal is connected with the second electrode plate.

17. The hybrid filter according to claim 16, wherein the first substrate further comprises a third connection block, the second substrate further comprises a fourth connection block, the third connection block is disposed on a side of the first electrode of the film bulk acoustic resonator close to the second substrate, the fourth connection block is disposed on a side of the second base substrate close to the first substrate, and is connected with the first conductive pillar among the m conductive pillars, the third connection block and the fourth connection block are connected by means of bonding, to enable the first electrode of the film bulk acoustic resonator to be connected with the second filtering inductor through the third connection block and the fourth connection block;

or, the first substrate further comprises a fifth connection block, and the second substrate further comprises a sixth connection block, and the fifth connection block is disposed on a side of the second electrode of the film bulk acoustic resonator close to the second substrate, the sixth connection block is disposed on a side of the second base substrate close to the first substrate and connected with the first conductive pillar among the n conductive pillars, the fifth connection block and the sixth connection block are connected by means of bonding, to enable the second electrode of the film bulk acoustic resonator to be connected with the first filtering inductor through the fifth connection block and the sixth connection block.

18. A filtering apparatus, comprising the hybrid filter according to claim 1.

19. A preparation method of the hybrid filter according to claim 1, comprising:

preparing the first substrate and the second substrate, respectively; and forming the first space between the first substrate and the second substrate which are disposed oppositely.

* * * * *